US006292765B1

United States Patent
Ho et al.

(10) Patent No.: US 6,292,765 B1
(45) Date of Patent: Sep. 18, 2001

(54) METHOD FOR AUTOMATICALLY SEARCHING FOR FUNCTIONAL DEFECTS IN A DESCRIPTION OF A CIRCUIT

(75) Inventors: Chian-Min Richard Ho, Mountain View; Robert Kristianto Mardjuki, Danville; David Lansing Dill, Redwood City; Jing Chyuarn Lin, Sunnyvale; Ping Fai Yeung, San Jose; Paul II Estrada, Los Alto; Jean-Charles Giomi, Menlo Park; Tai An Ly, Fremont; Kalyana C. Mulam; Lawrence Curtis Widdoes, Jr., both of San Jose; Paul Andrew Wilcox, Palo Alto, all of CA (US)

(73) Assignee: O-In Design Automation, San Jose, CA (US)

( * ) Notice: Subject to any disclaimer, the term of this patent is extended or adjusted under 35 U.S.C. 154(b) by 0 days.

(21) Appl. No.: 08/954,765

(22) Filed: Oct. 20, 1997

(51) Int. Cl.$^7$ ..................................... G06F 17/50
(52) U.S. Cl. ................. 703/14; 703/15; 703/16; 716/4
(58) Field of Search .................. 395/500.06, 500.05, 395/500.04; 714/30, 31; 703/13–15; 716/4, 5

(56) References Cited

U.S. PATENT DOCUMENTS

| | | | |
|---|---|---|---|
| 5,202,889 | * | 4/1993 | Aharon et al. ................... 714/739 |
| 5,479,414 | * | 12/1995 | Keller et al. ..................... 714/726 |
| 5,600,787 | * | 2/1997 | Underwood et al. ............... 714/30 |
| 5,623,499 | * | 4/1997 | Ko et al. ........................ 395/500.06 |
| 5,654,657 | * | 8/1997 | Pearce ............................ 327/163 |
| 5,680,332 | * | 10/1997 | Riami et al. ..................... 703/13 |
| 5,729,554 | * | 3/1998 | Weir et al. ....................... 714/31 |

OTHER PUBLICATIONS

Singer, S.; Vanetsky, L.;"Next Generation Test Generator (NGTG) for Digital Circuits", Proceedings of IEEE Autotestcon, pp. 105–112, Sep. 1997.*

Liang et al., "Identifying Invalid States for Sequential Circuit Test Generation", IEEE Trans. on Computer–Aided Design of Int. Circuits and Systems, vol. 16, Issue 9, pp. 1025–1033, Sep. 1997.*

Liang et al., "Identifying Invalid States for Sequential Circuit Test Generation", Proc. of the Fifth Asian Test Symposium 1996, pp. 10–15, Nov. 1996.*

Camurati et al., "Efficient Verification of Sequential Circtuis on a Paralle System", Proc. Third European Conference on Design Automation, pp. 64–68, Mar. 1992.*

* cited by examiner

Primary Examiner—Kevin J. Teska
Assistant Examiner—Douglas W. Sergent
(74) Attorney, Agent, or Firm—Skjerven Morrill MacPherson LLP; Omkar K. Suryadevara

(57) ABSTRACT

A programmed computer searches for functional defects in a description of a circuit undergoing functional verification in the following manner. The programmed computer simulates the functional behavior of the circuit in response to a test vector, automatically restores the state of the simulation without causing the simulation to pass through a reset state, and then simulates the functional behavior of the circuit in response to another test vector. A predetermined rule can be used to identify test vectors to be simulated, and the predetermined rule can depend upon a measure of functional verification, including the number of times during simulation when a first state transition is performed by a first controller at the same time as a second state transition is performed by a second controller. During simulation of the test vectors, manually generated tests or automatically generated checkers can monitor portions of the circuit for defective behavior.

37 Claims, 15 Drawing Sheets

Microfiche Appendix Included
(89 Microfiche, 4945 Pages)

Write into at least a majority of storage elements of the circuit the values held in Current State

81

Force each "Previous Value Register " to hold the value of first storage element in state prior to Current State

82

Force each "Asynchronous Mux Select Register" to the value that causes "Mux" to select its input from the "Previous Value Register"

83

Force the simulation to proceed for a non-zero time period.
(Time period is a small fraction of the simulation cycle period).

84

Force each "Asynchronous Mux Select Register" to the value that causes "Mux" to select its input from first storage element

METHOD FOR AUTOMATICALLY SEARCHING FOR FUNCTIONAL DEFECTS IN A DESCRIPTION OF A CIRCUIT

CROSS-REFERENCE TO RELATED APPLICATION

This application is related to and incorporates by reference herein in its entirety the concurrently filed, commonly owned U.S. patent application Ser. No. 08/955,329 filed by Tai An Ly, et al., and entitled "A Method for Automatically Generating Checkers for Finding Functional Defects in a Description of a Circuit", now U.S. Pat. No. 6,175,946, issued Jan. 16, 2001.

CROSS-REFERENCE TO MICROFICHE APPENDICES

Microfiche appendices 1–58 (of 89 sheets and 4,945 frames) that are attached hereto contain source code in C language for programming a computer, are a part of the present disclosure, and are incorporated by reference herein in their entirety.

A portion of the disclosure of this patent document contains material which is subject to copyright protection. The copyright owner has no objection to the facsimile reproduction by anyone of the patent document or the patent disclosure, as it appears in the patent and trademark office patent files or records, but otherwise reserves all copyright rights whatsoever.

FIELD OF THE INVENTION

The present invention relates generally to a method implemented by a programmed computer for verifying the functionality of digital circuits during development and testing. More specifically, the invention relates to an automated method for searching for functional defects in a description of a circuit-under-verification.

BACKGROUND OF THE INVENTION

Modern digital electronic circuits are typically designed at the register-transfer (RTL) level in hardware description languages such as Verilog (see "The Verilog Hardware Description Language", Third Edition, Don E. Thomas and Philip R. Moorby, Kluwer Academic Publishers, 1996) or VHDL (see "A Guide to VHDL", Stanley Mazor and Patricia Langstraat, Kluwer Academic Publishers, 1992). A circuit description in such a hardware description language can be used to generate logic circuit elements as described, for example, in U.S. Pat. No. 5,661,661 granted to Gregory and Segal.

Such hardware description languages facilitate extensive simulation and emulation of the described circuit using commercially available products such as Verilog-XL available from Cadence Design Systems, San Jose, Calif., Quick-HDL available from Mentor Graphics, Wilsonville, Oreg., Gemini CSX available from IKOS Systems, Cupertino, Calif., and System Realizer available from Quickturn Design Systems, Mountain View, Calif. These hardware description languages also facilitate automatic synthesis of ASICs (see "HDL Chip Design", by Douglas J. Smith, Doone Publications, 1996; "Logic Synthesis Using Synopsys", Pran Kurup and Taher Abbasi, Kluwer Academic Publishers, 1997) using commercially available products such as Design Analyzer and Design Compiler, available from Synopsys, Mountain View, Calif.

As described in "Architecture Validation for Processors", by Richard C. Ho, C. Han Yang, Mark A. Horowitz and David L. Dill, Proceedings 22$^{nd}$ Annual International Symposium on Computer Architecture, pp. 404–413, June 1995, "modern high-performance microprocessors are extremely complex machines which require substantial validation effort to ensure functional correctness prior to tapeout" (see page 404). As further described in "Validation Coverage Analysis for Complex Digital Designs" by Richard C. Ho and Mark A. Horowitz, Proceedings 1996 IEEE/ACM International Conference on Computer-Aided Design, pp. 146–151, November 1996, "the functional validation of state-of-the-art digital design is usually performed by simulation of a register-transfer-level model" (see page 146).

It is well known to monitor the operation of a simulation test by using, for example, "snoopers" generated manually as described at page 463, column 2, in "Hardware/Software Co-Design of the Stanford FLASH Multiprocessor", by Mark Heinrich, David Ofelt, Mark A. Horowitz, and John Hennessy, Proceedings of the IEEE, Vol 85, No. 3, pp. 455–466, March 1997, and in "Functional Verification Methodology for the PowerPC 604 Microprocessor", by James Monaco, David Holloway and Rajesh Raina, Proceedings 33$^{rd}$ IEEE Design Automation Conference, pp. 319–324, June 1996.

Another prior art system monitors the operation of a simulation test by using a "golden model" that is "written without reference to the RTL" and is "co-simulated using the same set of test vectors", as described by Chian-Min Richard Ho, in "Validation Tools for Complex Digital Designs", Ph.D. Dissertation, Stanford University Computer Science Department, November 1996 (at page 6, Section 2.1).

Prior-art products (for example, see the "Purify" product from Pure Atria, Sunnyvale, Calif., and the "Insure++" product from ParaSoft, Monrovia, Calif.) exist for testing software programs that may be written, for example in the programming language "C" described by Brian W. Kernighan and Dennis M. Ritchie in the book "The C Programming Language", Second Edition, PTR Prentice Hall, 1988. See "Purify User's Guide, Version 4.0", Pure Atria Corporation, 1996, and "Insure++ Automatic Runtime Debugger User's Guide", ParaSoft Corporation, 1996.

BRIEF DESCRIPTION OF THE DRAWINGS

FIG. 3G illustrates, in a flow chart, substeps performed in one implementation of step 4 in FIG. 3A.

SUMMARY

Figure 1A:
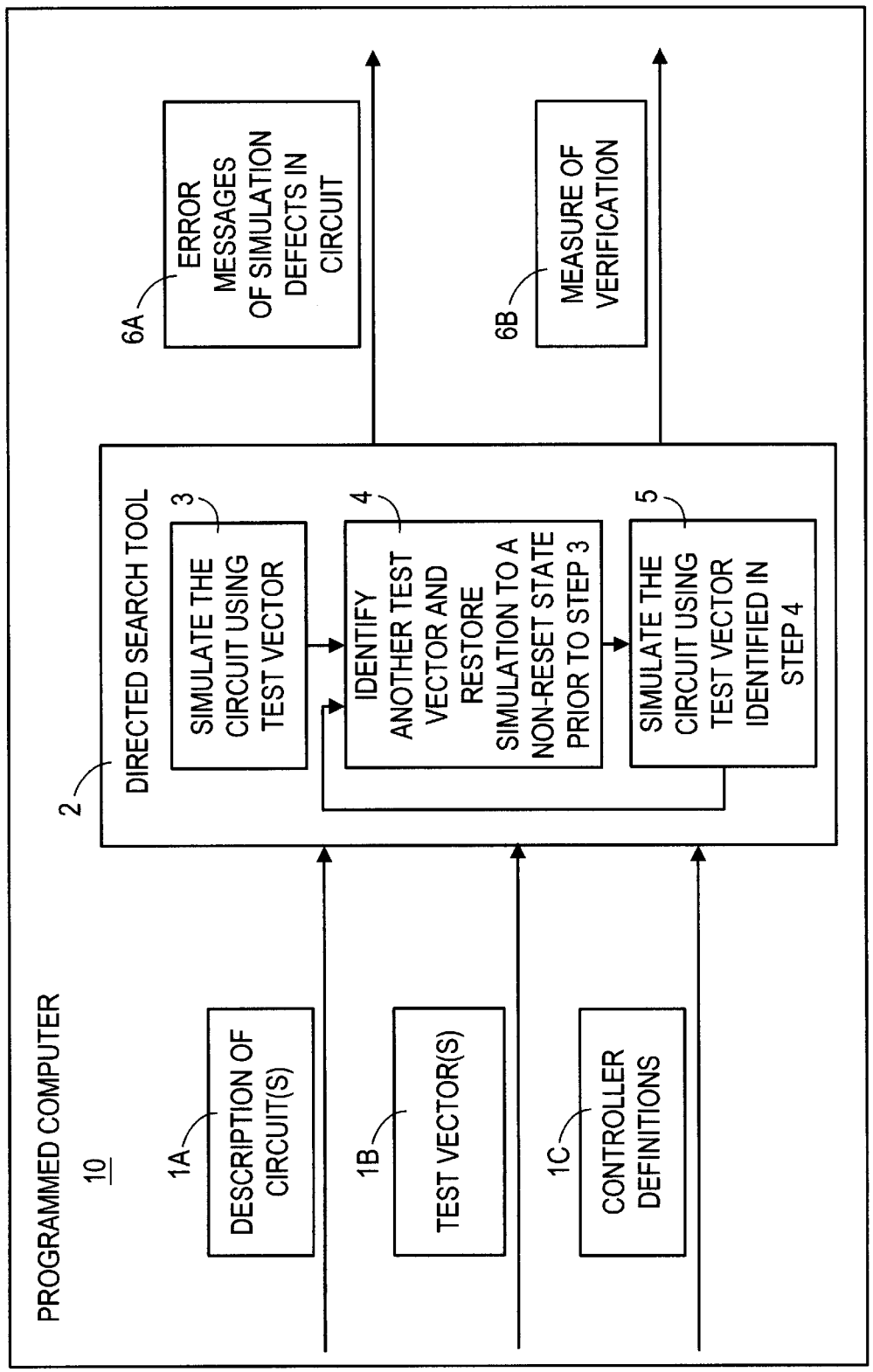
FIG. 1A illustrates, in a data flow diagram, use of a directed search tool of this invention that searches for functional defects in a description of a circuit.

A computer, when programmed in accordance with the invention performs the following steps: (1) simulates the functional behavior of a circuit (also called "circuit-under-verification") using one or more test vectors (e.g. complete sets of signals at the input terminals of the circuit), (2) automatically restores the simulation to a current state (described below), and (3) simulates the functional behavior of the circuit with one or more additional test vectors. The current state is represented, for example, by the set of signals in all storage elements of the circuit prior to the first simulating step. The current state is different from the reset state (described below), and can be attained, for example, by simulating a sequence of other test vectors.

In one embodiment, the programmed computer repeats the steps of automatically restoring and simulating until all test vectors in a group (obtained by applying a predetermined rule) have been used in the simulation. As an example, if the current state of simulation results from a pipeline stall, the programmed computer can cause the simulation to successively transition to multiple states that can occur immediately after the pipeline stall by repeating the steps of (1) automatically restoring the state resulting from the pipeline stall and (2) simulating with a different test vector.

During the step of automatically restoring, the programmed computer does not cause the simulation to pass through a "reset state" (i.e. a state of the simulation in response to a simulated reset signal applied to the circuit). In one embodiment, the programmed computer implements the step of automatically restoring by directly loading signal values of the current state into the simulated storage elements. Specifically, prior to simulation with the first test vector, the programmed computer reads and saves the current state. Thereafter, during the step of automatically restoring, the programmed computer directly loads the saved signal values into the storage elements, thereby to automatically restore the simulation directly to the current state. In another embodiment, the programmed computer implements the step of automatically restoring by restoring a state which is different from the current state and then using a sequence of test vectors to cause the simulation to transition to the current state through one or more states which are not reset states.

By use of the step of automatically restoring as described herein to return to the current state, the computer can be programmed to successively simulate multiple next states that are reachable from the current state by using different test vectors. Specifically, in one embodiment, the computer is programmed to use a predetermined rule to select a group of next states from the set of all possible next states and then to identify the test vectors that can cause the simulation to transition from the current state to each state in the selected group. When applying the predetermined rule, the programmed computer preferably uses a measure of functional verification of the circuit to select the group of next states.

In another embodiment, the computer is programmed to use a predetermined rule to identify test vectors with certain specific properties, for example, test vectors which set specific input pins of the circuit to specific values, e.g. 0.

In still another embodiment, the computer is programmed to simulate a randomly generated test vector after each step of automatically restoring, in this case, the programmed computer does not use a predetermined rule to identify a test vector.

In a first example, the circuit-under-verification includes a "controller" (i.e. a subcircuit) having a number of states, and the measure of verification identifies the states of the controller that have been reached in simulation. The programmed computer selects, as the group of next states, the states of the controller that have yet to be reached.

In a second example, the circuit-under-verification includes two controllers respectively capable of performing first state transitions, and second state transitions. The programmed computer selects as the group of next states the states that require performance of a pair of first and second state transitions that have not previously been performed simultaneously at least once. Identifying test vectors based on such un-exercised pairs of state transitions increases functional verification of interactions between the two controllers. Specifically, the programmed computer finds functional defects that result from unusual interactions between two controllers, such as synchronization errors, resource conflicts, and "one-cycle-off" problems that are not normally detected by prior art methods.

The method of automatically restoring a current simulation state before applying a new test vector has additional advantages over the prior art method of sequentially applying test vectors. Specifically, in the prior art method, many of test vectors that are simulated result in repetition of behaviors which have already been exercised, thus they do not result in new behaviors of the circuit being exercised, and they do not result in finding new functional defects. Using the capability of directly and automatically restoring the simulation to a specific state, many test vectors can be efficiently simulated starting from a set of preferred states where new behaviors can be exercised using selected test vectors.

In one embodiment, the programmed computer automatically generates descriptions of additional circuits (hereinafter "checkers") that monitor portions of the circuit-under-verification, and flag behaviors of the portions in conformance with known defective behaviors. During simulation, each checker is coupled to an instance of an arrangement of circuit elements associated with a defective behavior. Each checker monitors signals flowing to and from the instance and generates an error message on detecting the known defective behavior.

Use of automatically generated checkers in combination with automatic state restoration and simulation as described herein has several advantages. Specifically, the checkers flag an error as soon as the error occurs in simulation, emulation, or in a semiconductor die, because each checker monitors defective behavior of one instance of an arrangement in the circuit. Therefore, diagnosing errors flagged by automatically generated checkers is much easier than diagnosing errors flagged by end-to-end tests. Furthermore, functional verification can be terminated as soon as an error message is generated, thereby eliminating the generation and diagnosis of additional error messages (generated by continuing the functional verification). Hence, use of checkers as described herein eliminates the prior art need to simulate after an error occurs (e.g. in some cases for several hours) until an effect of the error is detected by an end-to-end test.

DETAILED DESCRIPTION

A computer 10 (FIG. 1A) when programmed by software (hereinafter "directed search tool") in accordance with this invention: simulates the functional behavior of a circuit (also called "circuit-under-verification") using a test vector (as illustrated by step 3), automatically restores simulation to a non-reset state (as illustrated by step 4), and simulates the functional behavior using another test vector (as illustrated by step 5). Computer 10 receives as inputs a description of the circuit-under-verification (e.g. in file 1A) and a test vector (e.g. in file 1B), and generates error messages (e.g. in file 6) describing functional defects found during simulation. Files 1A and 1B have a description of circuitry and signal values similar or identical to prior art descriptions of circuitry and test vectors, for example, as described in the above-referenced "Validation Tools for Complex Digital Designs", by Ho.

Hereinafter, all references to a directed search tool are intended to mean an appropriately programmed computer. Such a programmed computer 10 is preferably a workstation computer that includes memory (e.g. 512MB of random access memory), and central processing unit (CPU) of the type well known to a person skilled in the art of electronic design automation. Moreover, simulation of the functional behavior of a circuit is sometimes described herein as simply simulation of the circuit. Such simulation can be performed by programming computer 10 with simulation software, such as Verilog-XL available from Cadence Design Systems, San Jose, Calif., QuickHDL available from Mentor Graphics, Wilsonville, Oreg., and Gemini CSX available from IKOS Systems, Cupertino, Calif.

Figure 1B:
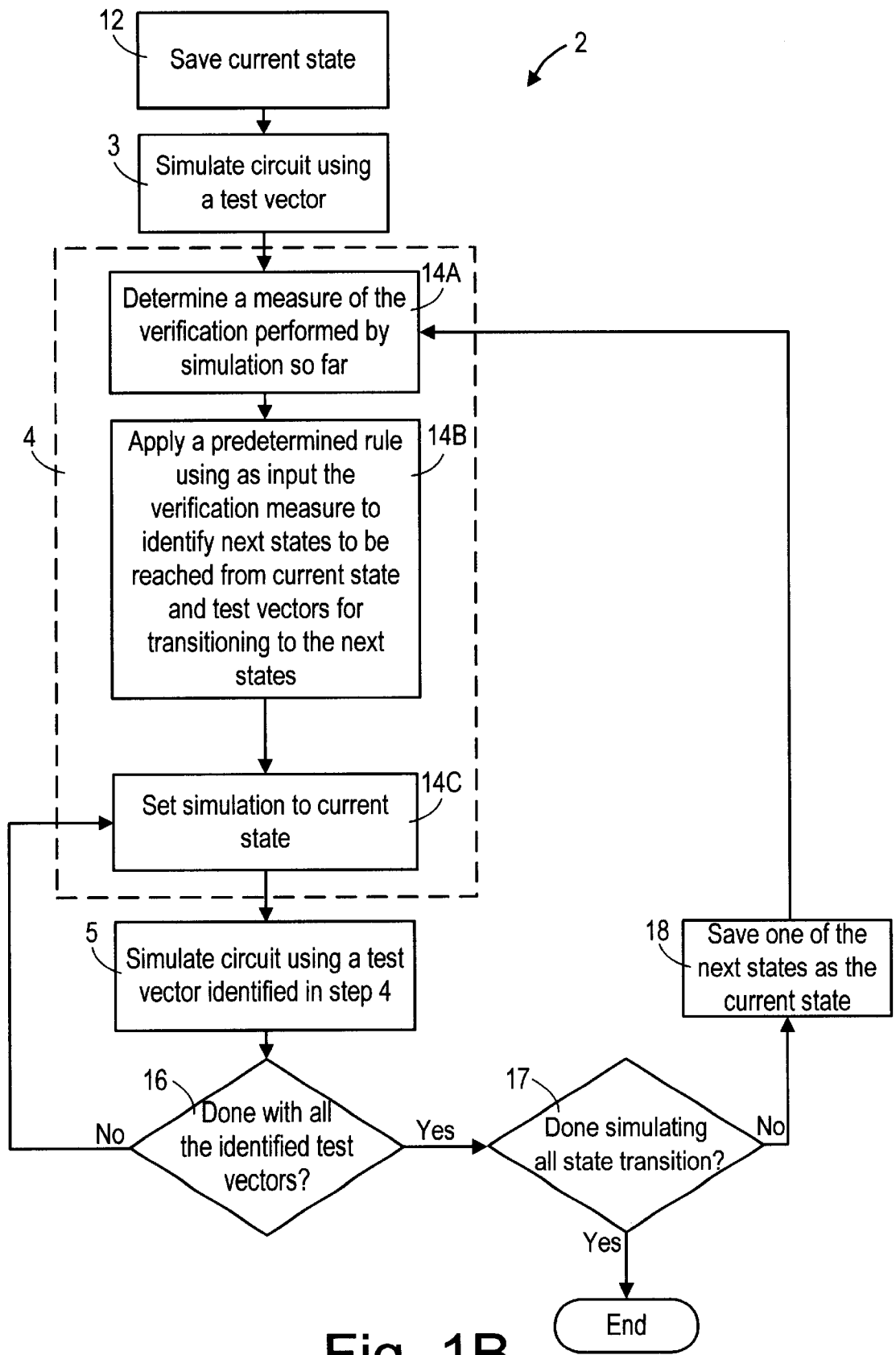
FIG. 1B illustrates, in a flow chart, steps performed by one particular implementation of the directed search tool of FIG. 1A.
Figure 1C:
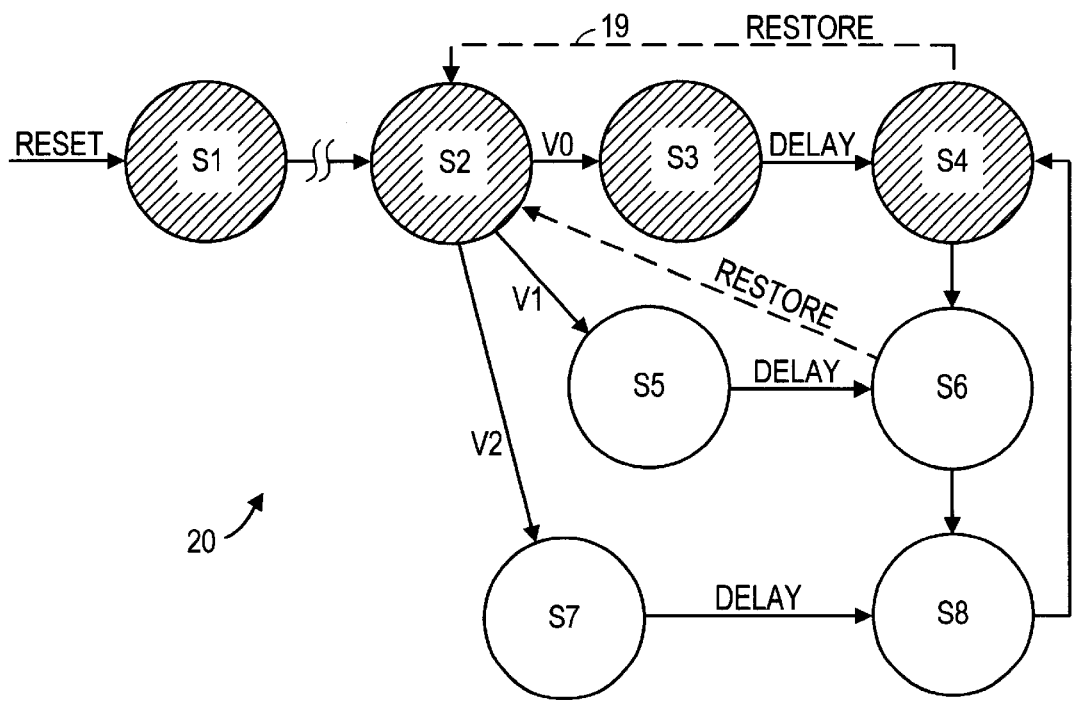
FIG. 1C illustrates, in a state diagram, transitions between various states of a circuit under simulation.

In one embodiment, directed search tool 2 (FIG. 1B) simulates a circuit having a single controller, e.g. controller 20 that has eight states S1–S8 (FIG. 1C). Directed search tool 2 identifies controller 20 in the circuit's description (e.g. in file 1A) in response to a directive in file 1C, for example, the directive $$\text{\$0In\_init\_search\_group("controller\_20\_state\_var")}$$

which identifies "controller$_{20}$_state_var" as a state variable. As there is only controller 20 in the circuit-under-verification, in the following description the same eight states S1–S8 are also used to identify the state of the simulation.

Figure 1D:
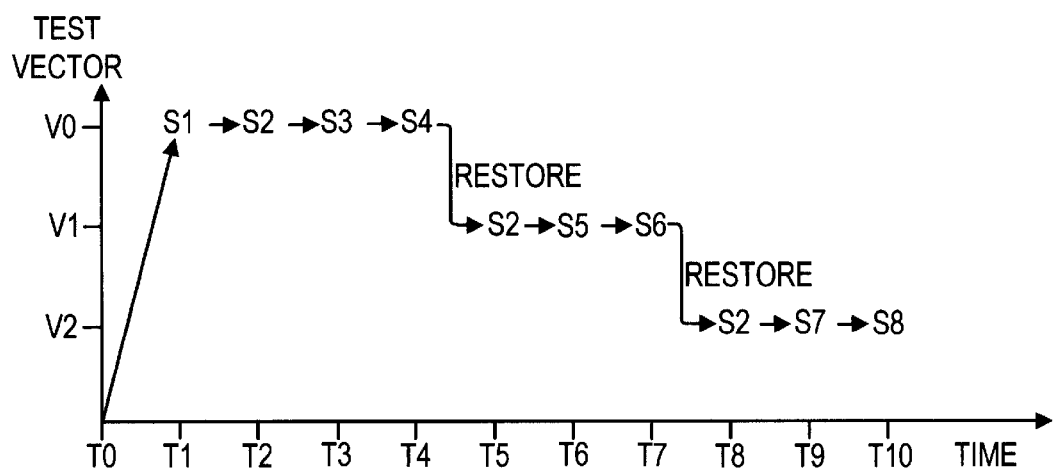
FIG. 1D illustrates, in a graph of time versus use of test vectors, a simulation sequence of state transitions of FIG. 1C during performance of the method illustrated in FIG. 1B.

Controller 20 has a reset state S1 that is the state of simulation at time T1 (FIG. 1D) in response to reset at time T0. The simulation transitions from state S1 to state S2 at time T2, for example in response to a test vector (e.g. in file 1B) provided by the user. Alternatively, a user can simply change the state of simulation, i.e. overwrite state S1 with state S2. Thereafter, directed search tool 2 saves (in step 12) the current state S2, and simulates (in step 3) the circuit (e.g. described in file 1A) using a test vector V0 (e.g. in file 1B). In response to the test vector V0, the simulation transitions from state S2 to state S3 at time T3, and automatically to state S4 after a delay, e.g. at time T4 (FIG. 1D)

Thereafter, directed search tool 2 performs a step 4 (FIG. 1B) that includes substeps 14A–14C, in this particular implementation. In substep 14A, directed search tool 2 determines a measure of the functional verification completed in prior steps. For example, directed search tool 2 determines that states S1–S4 (shown hatched in FIG. 1C) have been simulated in prior steps. In substep 14B, directed search tool 2 uses the measure of functional verification (e.g. the simulated states S1–S4) to identify the next states that can be reached from the current state (e.g. state S2) but have not been simulated in prior steps. In this particular example, directed search tool 2 enumerates all possible states S1–S8 and then determines that the group of next states includes non-simulated states S5–S8 (FIG. 1C). Next, in the same substep 14B, directed search tool 2 applies a predetermined rule and identifies one or more test vectors required to transition from the current state S2 to one or more of next states S5–S8 (see FIG. 1C). In this particular example, directed search tool 2 finds (e.g. by checking the effect of all valid input values on the circuit in the current state) a first test vector V1 (see FIG. 1D) required to transition from state S2 to state S5, and a second test vector V2 required to transition from state S2 to state S7.

Thereafter, in substep 14D, directed search tool 2 sets the simulation at time T5 (FIG. 1D) to the current state S2 that was saved in step 12, e.g. writes the value representing S2 into storage elements that hold the state of simulation (as illustrated by a dashed arrow 19 in FIG. 1C).

Then, directed search tool 2 simulates (see step 1 in FIG. 1B) the circuit using test vector V1 that was identified in step 14 (FIG. 1B). Next, directed search tool 2 checks (see step 16) whether all of test vectors V1 and V2 (identified in step 4) have been used, and if not returns to step 4 (i.e. to substep 14C), and uses the remaining test vector V2 at time T8 (FIG. 1D). If all of test vectors V1 and V2 have been used (e.g. at time T10), and all state transitions have been simulated, directed search tool 2 stops the simulation (see step 17 in FIG. 1B).

Directed search tool 2 simulates behavior of controller 20 (as identified in file 1C) in states S5 and S7 that would otherwise not have been simulated by use of test vector V0 (in file 1B). Specifically, when controller 20 reaches state S4, it can proceed only to states S6 and S8. Controller 20 transitions to states S5 and S7 only from state S2, and cannot reach S5 and S7 from S4, unless restored as described herein.

Therefore, directed search tool 2 finds and exercises difficult-to-reach behaviors, because step 4 finds unvisted states from a "known good state"(i.e. a state that has already been simulated, e.g. current state S2). Such use of a known good state complements existing verification methodologies, because circuit designers find and fix functional errors found in response to typical stimuli that are provided in the test vectors (e.g. in file 1B in FIG. 1A).

When all state transitions have not been exercised in step 17, directed search tool 2 saves (see step 18) one of the next states as the current state, and thereafter returns to step 4 (i.e.

to substep 14A) (described above). The remaining next states are saved and used as current state in future applications of step 14B. In this manner, directed search tool 2 attempts to exercise all state transitions, while using the measure of verification to minimize repetition of simulations that have already been performed. Directed search tool 2 also minimizes the repetition of previously performed simulations by simply automatically restoring the simulation to a non-reset state (as illustrated in step 4). In the above-described example of controller 20, use of the verification measure eliminates states S3 and S4 (FIG. 1C) from simulation after time T5 (FIG. 1D), while restoration to state S2 eliminates repetitive simulation of state S1 and any number of additional states that may exist between states S1 and S2. Such elimination of the repetitive simulation performed by the prior art methods (e.g. by resetting the simulation to reset state S1 for each simulation) provides significant advantages in the form of increased speed and efficacy in finding functional defects in the circuit-under-verification.

Figure 2A:
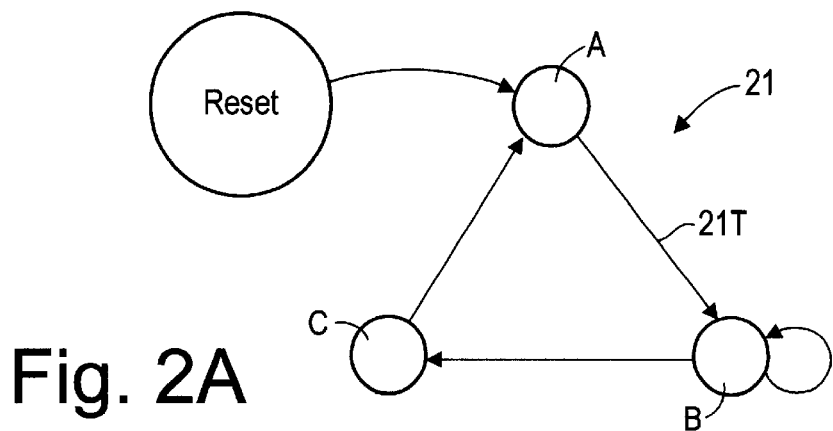
FIGS. 2A–2C illustrate, in state diagrams, examples of different controllers in a circuit under simulation.
Figure 2B:
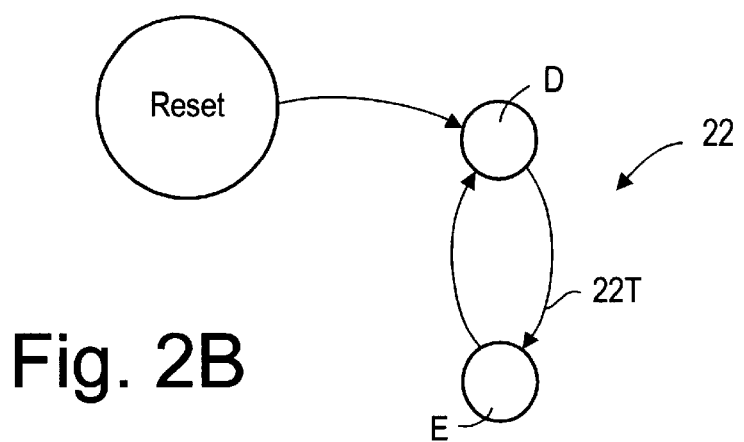

Although simulation of a single controller (e.g. controller 20) has been described above, a circuit-under-verification (e.g. as described in file 1A) can include a number of such controllers (e.g. controllers 21 and 22 illustrated in FIGS. 2A and 2B). In such a case, directed search tool 2 illustrated in FIG. 1B can be used multiple times to exercise each of such controllers individually. However, functional defects that are likely to result from unusual interactions between such controllers cause, for example, synchronization errors, resource conflicts, and "one-cycle-off" problems that may not be found by such simulation of individual controllers.

Figure 2C:
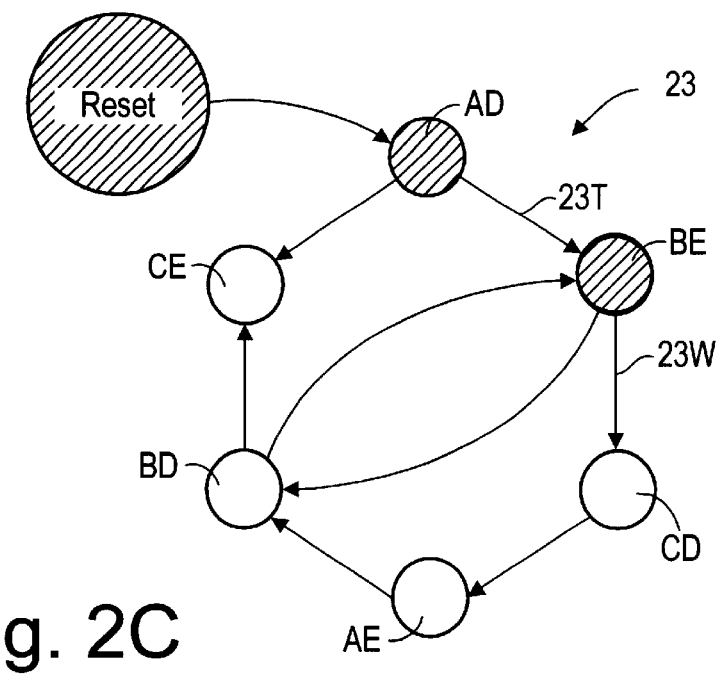
Figure 2D:
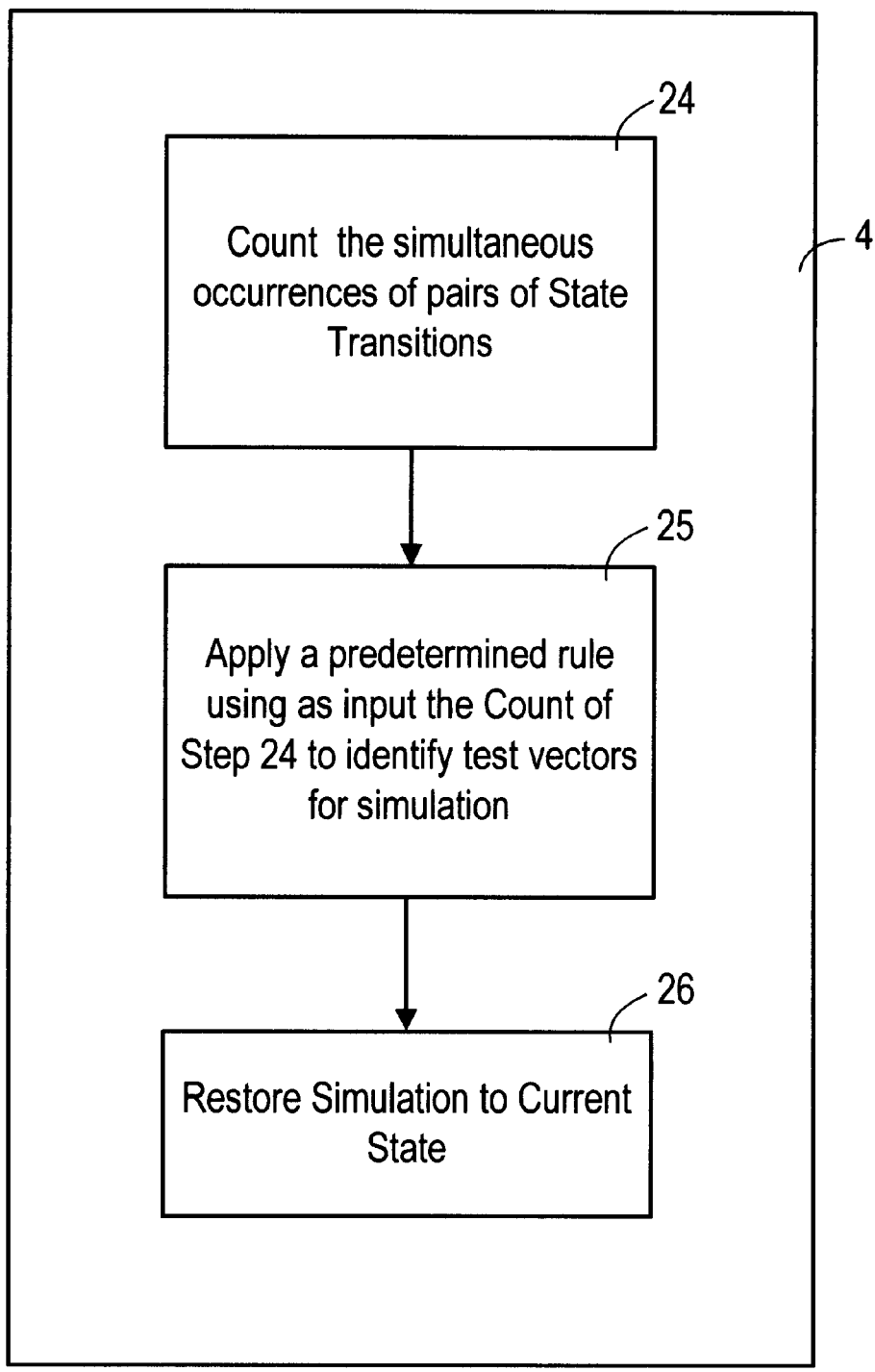
FIG. 2D illustrates, in a flow chart, substeps performed in another implementation of step 4 of FIG. 1A.

Therefore, in another embodiment, directed search tool 2 implements, in step 4, substeps 24–26 (see FIG. 2D) that searches for such functional defects. Substep 24 counts the simultaneous occurrences of pairs of state transitions, wherein each pair consists of a state transition of each of the two controllers. In a circuit-under-verification having controllers 21 and 22, directed search tool 2 enumerates all possible next states of controllers 21 and 22, and the corresponding pairs of state transitions. In the above-described example, the current states of controllers 21 and 22 are respectively states A and D as illustrated by a paired state AD (see "paired" controller 23 in FIG. 2C) that is obtained by pairing states A and D of controllers 21 and 22. The next states of controllers 21 and 22 are B and E respectively that are reached by respective transitions 21T and 22T (FIGS. 2A and 2B), as illustrated by paired transition 23T (FIG. 2C).

Thereafter, in substep 25, directed search tool 2 applies a predetermined rule, using as input the count of step 24 to identify a test vector for simulation. In the above-described paired controller 23 (FIG. 2C), if states AD, BE and BD have already been simulated (as illustrated by hatching in FIG. 2C), directed search tool 2 identifies (in step 25) a test vector for transitioning to state CD in response to the test vector 23W. Next, directed search tool 2 automatically restores the simulation to the current state BE. Step 25 is illustrated by the function "zi_dpli_poke" in module sd, at lines 2840 to 3156 of microfiche Appendix 41.

Figure 2E:
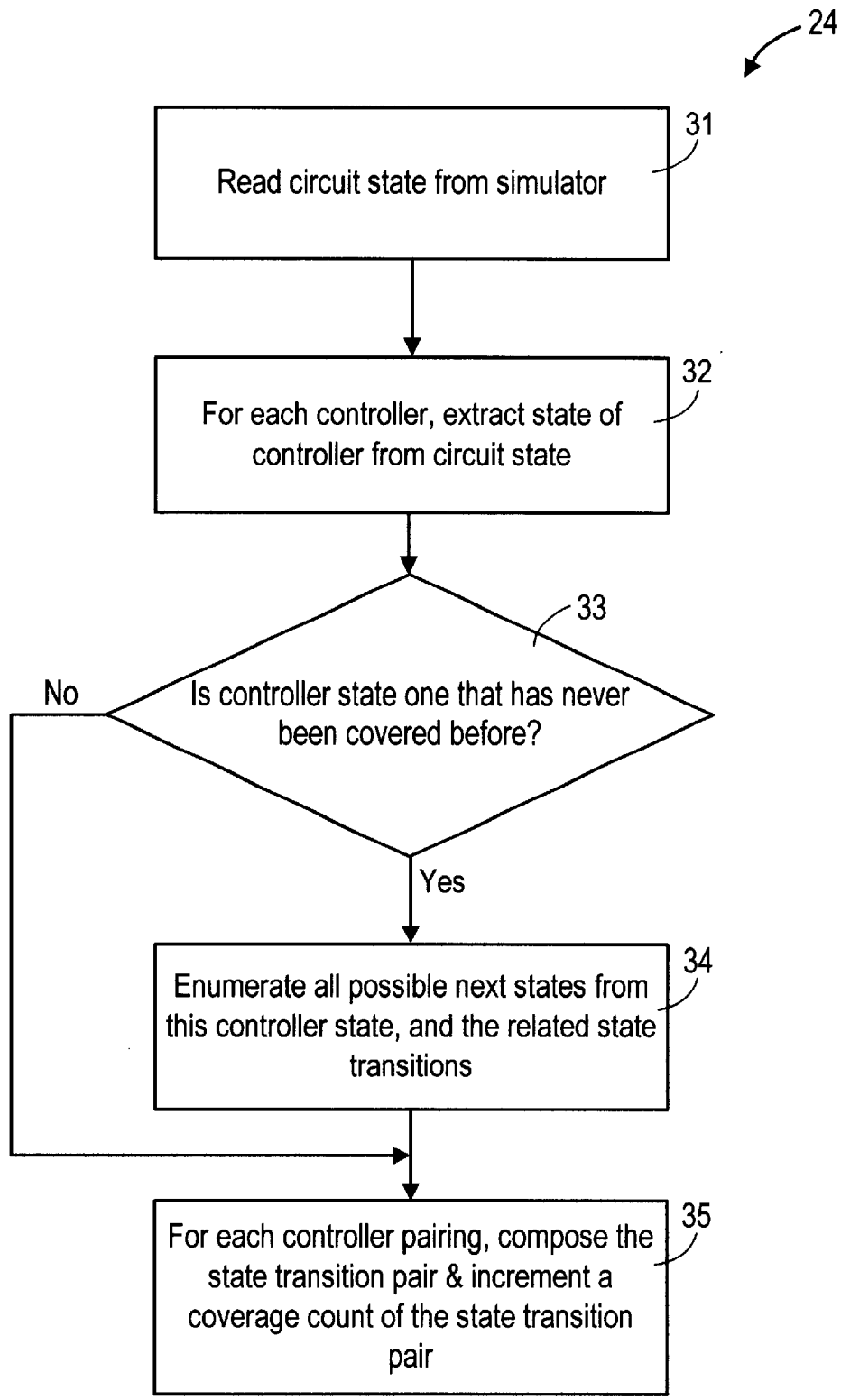
FIG. 2E illustrates, in a flow chart, actions performed during implementation of substep 24 in FIG. 2D.

In one particular implementation, directed search tool 2 implements substep 24 by performing actions 31–35 (FIG. 2E). Specifically, directed search tool 2 reads the current state of the circuit-under-verification from the simulator (as illustrated by action 31). Action 31 is illustrated by the function "zi_dpli_peek" in module sd, at lines 3272 to 3327 of microfiche Appendix 41. In this particular action, the signal in each storage element (e.g. registers 61–65 in FIG. 2H) of the circuit is read, and all the signals together form the state of the circuit. Next, directed search tool 2 extracts from the current state of the circuit-under-verification, the state of each controller (as illustrated by action 32). Action 32 is illustrated by the function "zi_fsmdb_extract_state" in module fsmdb, at lines 3327 to 3351 of microfiche Appendix 23. Thereafter, if any controller state is found to be simulated for the first time, directed search tool 2 enumerates all possible states that can be reached from that newly simulated state, and also enumerates all related state transitions (as illustrated in action 34). Action 34 is illustrated by the function "zi_ienum_arcs" in module satsetup, at lines 2087 to 2137 of microfiche Appendix 40.

Next, directed search tool 2 composes a state transition pair for the most recently performed simulation step, and increments a count of the state transition pair (as illustrated in action 35). Action 35 is illustrated by the function "zi_fsmdb_srchgrp_update" in module fsmdb, at lines 5122 to 5208 of microfiche Appendix 23. If the controller state extracted in action 32 was previously simulated, directed search tool 2 skips performing action 34 and directly performs action 35 (described above).

Figure 2F:
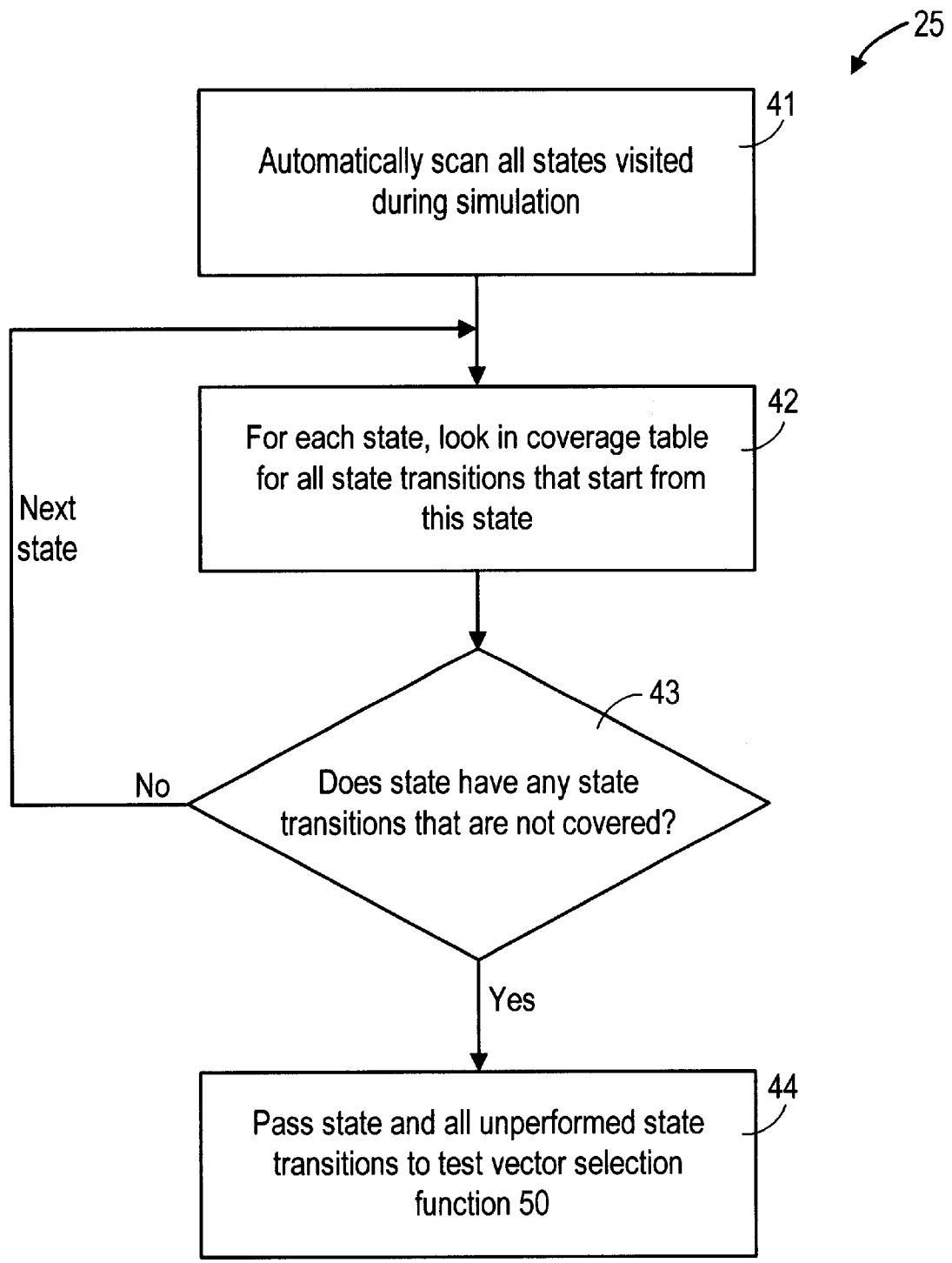
FIG. 2F illustrates, in a flow chart, actions performed in substep 25 in FIG. 2D.

In the above-described pair controller 23, when state BE is first simulated, the previous state being state AD, the state of the circuit is retrieved from the simulator by step 31. Thereafter, step 32 extracts the state of each of the user defined controllers (e.g. in file 1C), finding controller 21 to be in state B and controller 22 to be in state E respectively. Since this is the first time that the states B and E respectively have been simulated, therefore step 34 is applied to both controllers. Hence, controller 21 is enumerated to find all the next states from state B, namely B and C, and controller 22 is enumerated to find all the next states from state E, namely D. Step 34 is performed in preparation for step 42 (FIG. 2F). Thereafter, step 35 composes the transition pair that was covered, in this example, from state AD to state BE, and increments a count indicating the number of times the transition AD to BE has been covered in simulation.

Figure 2G:
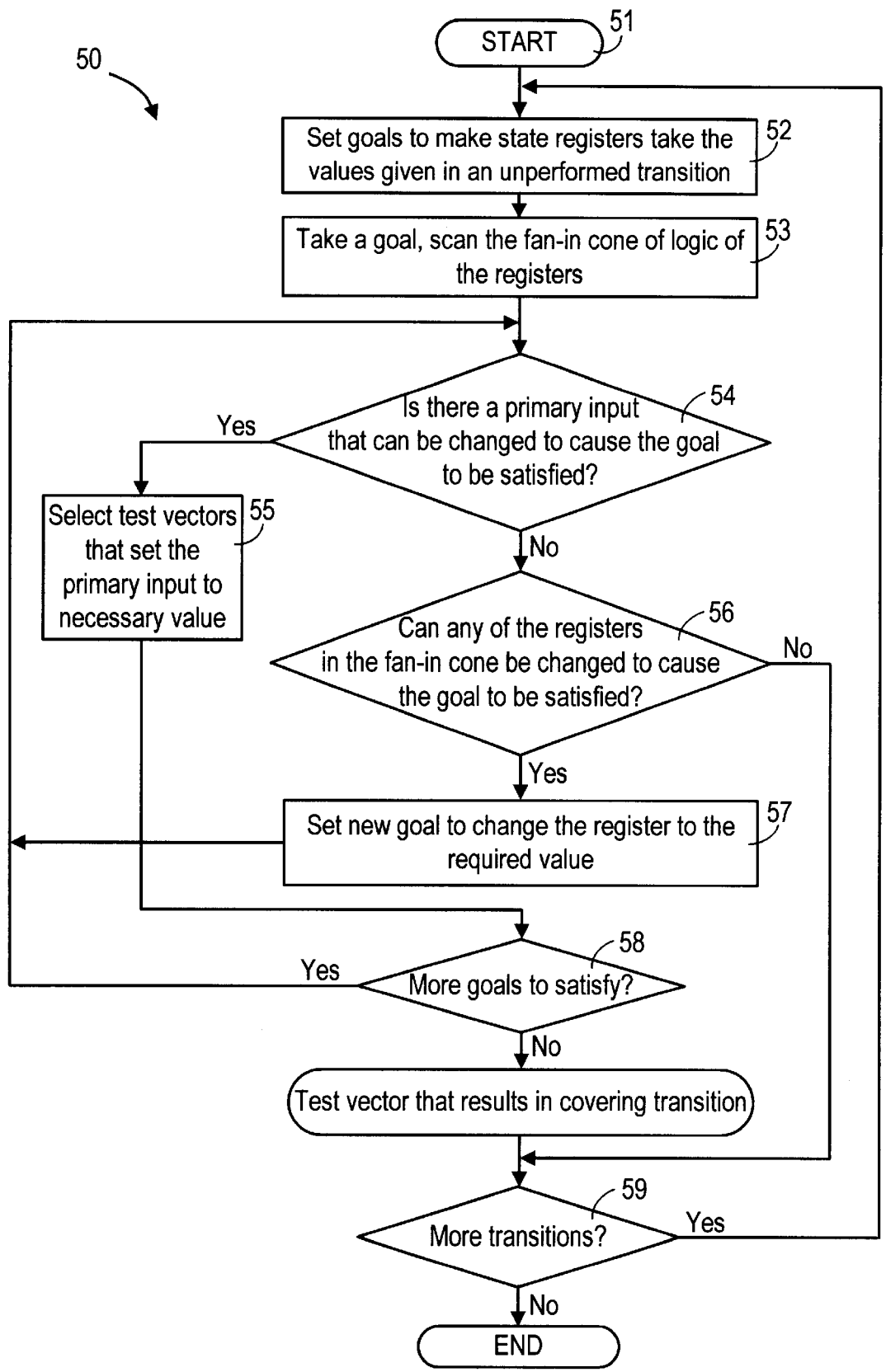
FIG. 2G illustrates, in a flow chart, substeps performed by a test vector selection function invoked in action 44 of FIG. 2F.

During the implementation of substep 25 (FIG. 2D) directed search tool 2 performs actions 41–45 (FIG. 2F). Specifically, directed search tool 2 automatically scans (in action 41) all states that have been simulated. Action 41 is illustrated by the function "zi_score_state" in module srch_ctrl, at lines 1081 to 1744 of microfiche Appendix 45. Thereafter, directed search tool 2 examines the verification measures (as discussed above in reference to substep 24) for all state transitions that start from the current state. Next, directed search tool 2 checks whether any of the state transitions has not yet been performed during the simulation (as illustrated by action 43). If so, directed search tool 2 presents the current state and all state transitions that have not been performed to a function 50 (FIG. 2G) for identification of test vectors. Action 43 uses functions "zi_fsmdb_srchgrp_lookup" in module fsmdb, at lines 5450 to 5544 of microfiche Appendix 23, and function "zi_fsmdb_ifsm_lookup_state" in module fsmdb, at lines 3363 to 3399 of microfiche Appendix 23. Action 43 is illustrated by function "zicandidatenewarc" in module srch_ctrl, at lines 1800 to 1860 of microfiche Appendix 45.

Figure 2H:
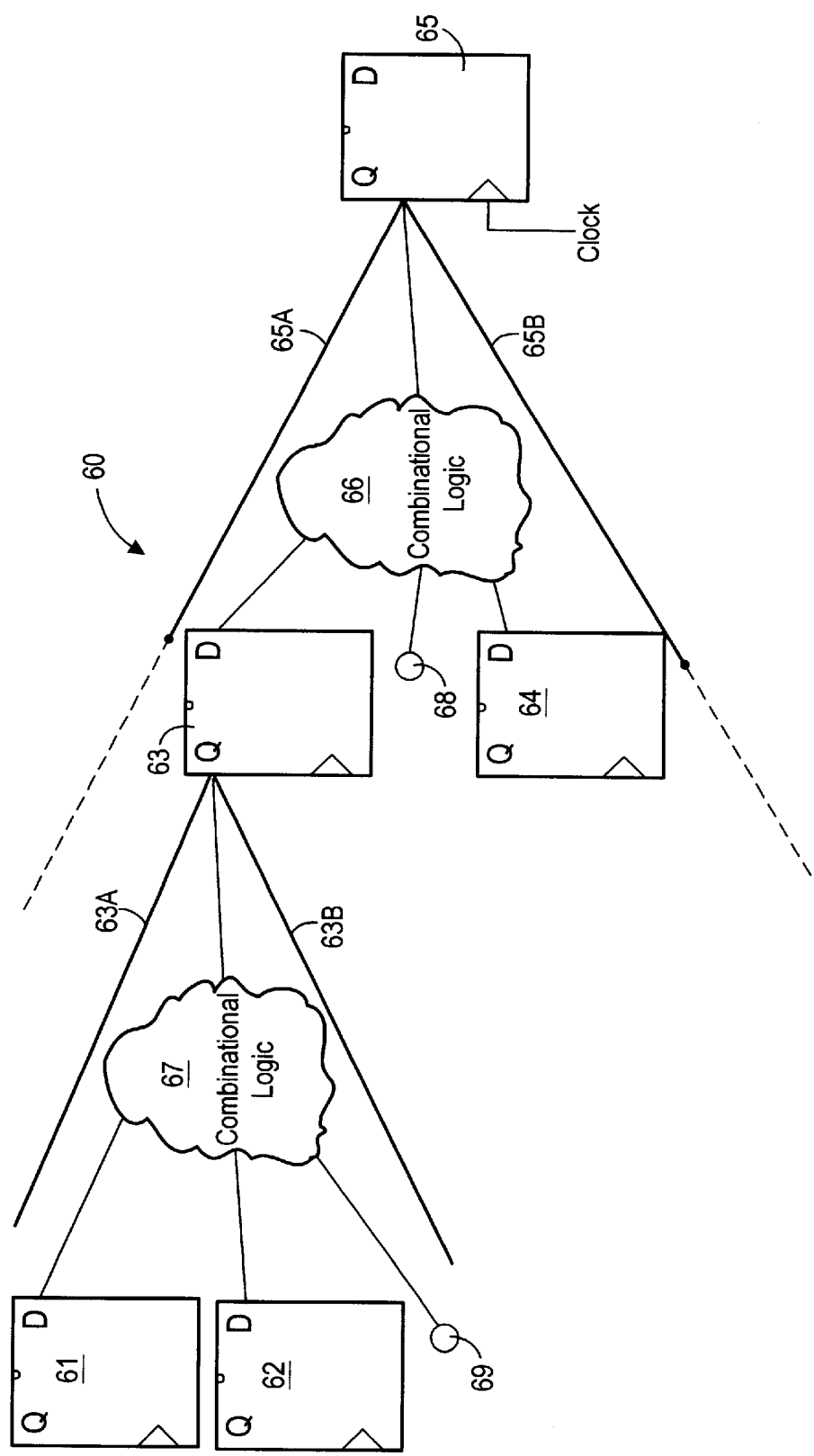
FIG. 2H illustrates, in a circuit diagram, use of the test vector selector function to find a test vector.

Function 50 performs steps 51–59 to identify test vectors that exercise one or more of the not-yet-performed state transitions. Specifically, in step 51, function 50 starts executing, and performs any necessary initialization. An example of the initialization task is illustrated by the function "zi_sat_setup" in module satsetup, at lines 3713 to 3778 of microfiche Appendix 40. Thereafter, in step 52, function 50 sets goals to make registers (hereinafter "state registers") of the circuit-under-verification take values which will result in performance of a not-yet-performed state transition. Step 52 is illustrated by the function "zi__sat__set__goals" in module sat, at lines 1915 to 1972 of microfiche Appendix 39. Next, in step 53, function 50 takes a goal, and traverses the circuit backwards from an input terminal (e.g., for example from the "Q" terminal of a flip-flop 65 in a circuit 60 (FIG. 2H). Step 53 is illustrated by the function "zi__sat__backtrace" in module sat, at lines 1590 to 1625 of microfiche Appendix 39.

In circuit 60, all circuit elements reached by the backward traversal are illustrated in FIG. 2H within a space called "cone of logic". The cone of logic is delimited by lines 65A and 65B that intersect at the "Q" terminal of flip-flop 65, and fan out backward to include storage elements, e.g. registers 61–64, groups of logic elements 66 and 67, and input terminals 68 and 69. The cone of logic is transitive, i.e. the cone of logic of flip-flop 65 includes the fan-in of flip-flop 63 because flip-flop 63 fans-out to the "Q" terminal of flip-flop 65. Each level of flip-flops in the cone of logic is considered to be one cycle of logic. The cone of logic extends backwards for some number of cycles of logic and is terminated by a maximum cycle number that is set by a budget measure, either by the user or automatically. The cone of logic is established by step 51 for each of the state registers for which a goal exists. Thereafter, all register values outside the cone of logic are considered constants. Registers inside the cone of logic are also considered constants if there are no input terminals that can change values to affect the value of the register.

Thereafter, in step 54, function 50 checks if a change in a signal at an input terminal (e.g. one of terminals 68 and 69) is sufficient to satisfy the goal. If so, function 50 selects test vectors necessary to set the input terminal to the required signal value (as illustrated in step 55), and goes to step 58 to check if more goals need to be satisfied.

In step 54, if the goal cannot be satisfied, function 50 checks if a signal in any one of the registers 61–64 in the cone of logic can be changed to satisfy the goal (e.g. if the values are symbols of the type used in symbolic simulation). If none of the values in registers 61–64 can be changed (e.g. because the values are constants), function 50 goes to step 59 to check if any more state transitions remain not-yet-performed (as illustrated by step 59). If so, function 50 returns to step 52 (described above). Alternatively, if in step 52 if a register does not have a constant value, function 50 sets the goal to change the register to the necessary value required to satisfy the current goal (as illustrated in step 57) and thereafter returns to step 54 if more goals remain to be satisfied. The steps 54–57 are illustrated by the function "zi__sat__satisfy" in module sat, at lines 1985 to 2064 of microfiche Appendix 39.

In one embodiment, function 50 is assisted by performing a symbolic simulation of the circuit in parallel with the normal circuit simulation in steps 3 and 5 of FIG. 1A. A symbolic simulator is illustrated by the function "zi__syms__run" in module ss, at lines 2416 to 2536 of microfiche Appendix 46.

Thereafter, during backward traversal through the cone of logic, when function 50 reaches a storage element containing a symbol, function 50 simply picks an appropriate value in the range represented by the symbol that satisfies the goal. Therefore, symbolic simulation eliminates the need to traverse backward all the way to the input terminal that originated the range of values at the storage element.

Although the controllers mentioned heretofore refer to controllers in the circuit, additional controller descriptions, called "protocol controllers", can be used to represent the allowable test vectors that can be applied to the input terminals of the circuit. In such a case, the verification measure in the above description can be a count of the simultaneous performance of a state transition of a controller of the circuit and a state transition of a protocol controller.

Therefore, in another embodiment, directed search tool 2 implements in step 32 (FIG. 2E), extraction of the both the state of a controller of the circuit and the state of a protocol controller. In one implementation, a description of a protocol controller is combined with the circuit description and used as input for directed search. In this case, step 32 extracts the protocol controller state in the same manner as it extracts the circuit state.

Figure 3A:
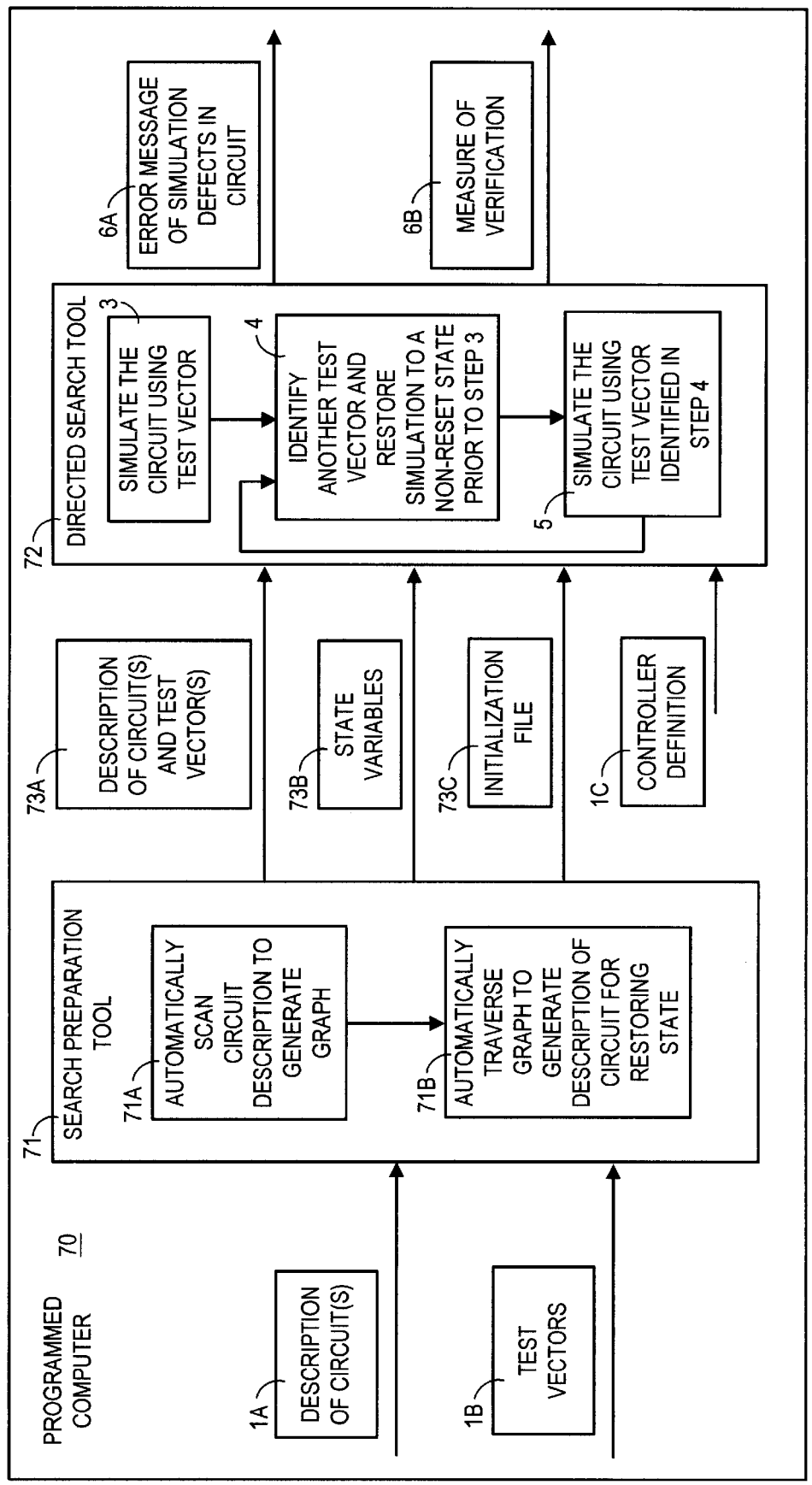
FIG. 3A illustrates, in a data flow diagram, use of a search preparation tool to refine a description of the circuit-under verification.
Figure 3B:
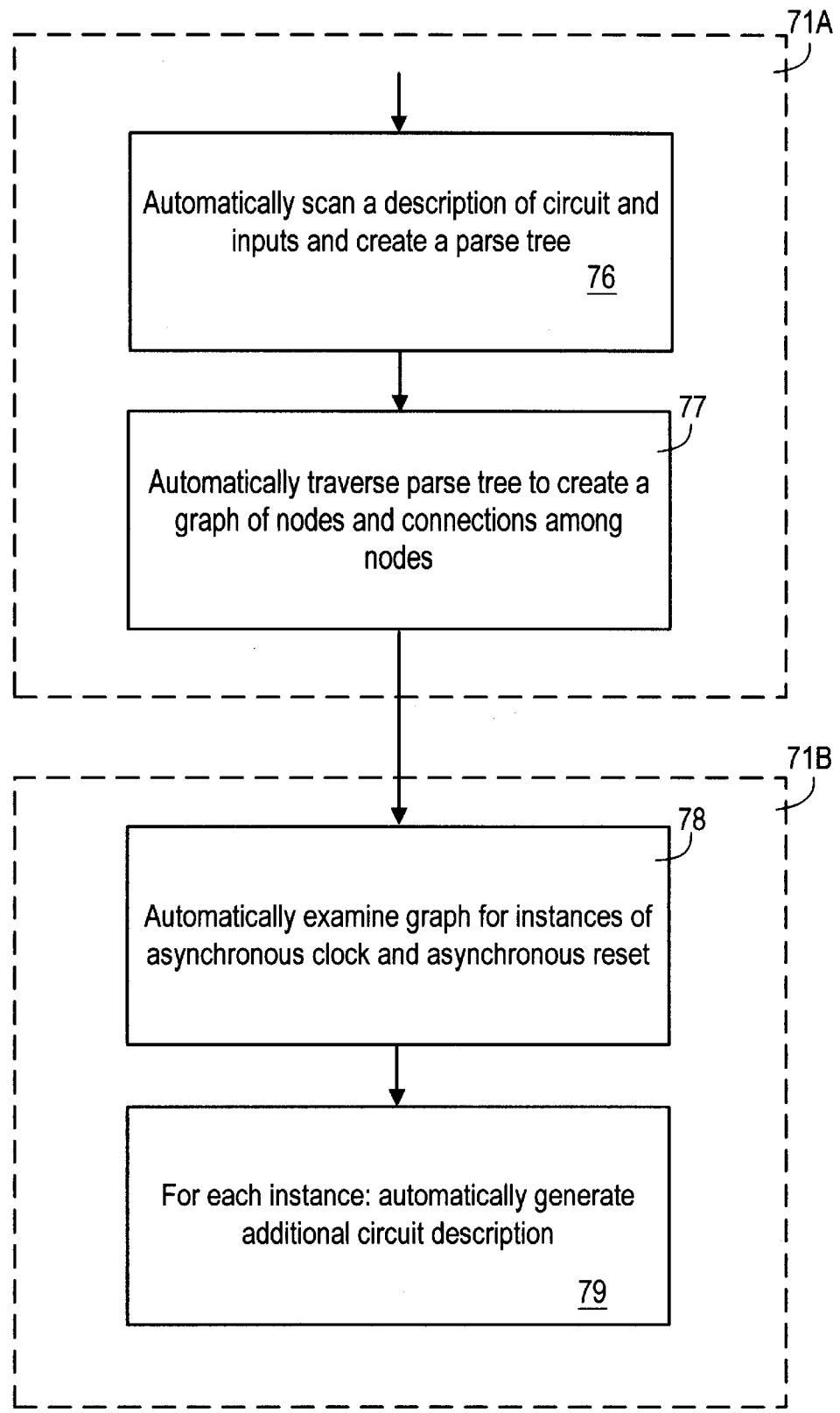
FIG. 3B illustrates, in a flow chart, the steps performed by the search preparation tool of FIG. 3A.
Figure 3C:
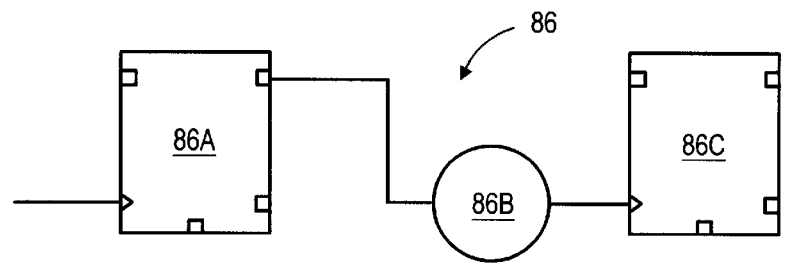
FIG. 3C illustrates, in a graph, an arrangement (of two storage nodes and a logic node and connections) that can cause asynchronous behavior in a circuit-under-verification by clocking a storage element with an asynchronous signal.

In another embodiment, a computer 70 is programmed with a search preparation tool 71 that automatically scans (as illustrated by step 71A) descriptions of circuitry (e.g. in file 1A) to generate a graph, and thereafter automatically traverses (see step 71B) the graph to generate a description that is refined, e.g. by eliminating unnecessary circuitry, such as a declared register that is the destination of an assignment statement in a Verilog "always" statement. Specifically, in step 71A (FIG. 3B), search preparation tool 71 automatically creates a parse tree (see substep 76) and thereafter traverses (see substep 77) the parse tree to create the graph. Substeps 76 and 77 are similar or identical to substeps 210 and 220 described in reference to FIG. 2 in the U.S. patent application Ser. No. 08/955,329 incorporated by reference above. Therefore, search preparation tool 71 generates a description (e.g. in file 73A in FIG. 3A) that describes circuit elements remaining in the graph resulting from flattening and load refinement (described in reference to actions 408 and 409 in FIG. 4A in the U.S. patent application Ser. No. 08/955,329 incorporated by reference above). One implementation of this embodiment is illustrated in function "zi__nl__create__graph" in module nl, at lines 1691 to 1771 of microfiche Appendix 33 and in function "zi__elab__design" in module elab, at lines 4633 to 4702 of microfiche Appendix 18.

In this particular embodiment, search preparation tool 71 also describes (e.g. in file 73A) one or more circuits (also called "restoration circuits") that may be required (depending on the circuit-under-verification) for restoring signals (also called "asynchronous signals") that occur in the clock cycle immediately following the current state, and that may not occur after restoration of simulation to the current state. During simulation, directed search tool 72 saves the state at each clock cycle, and uses the restoration circuits and the state (hereinafter "previous state") that immediately precedes the current state to recreate such asynchronous signals after state restoration. One implementation of such a directed search tool 72 is illustrated by function "zi__srch__ctrl" in module srch__ctrl, at lines 2024 to 2616 in microfiche Appendix 45.

Figure 3D:
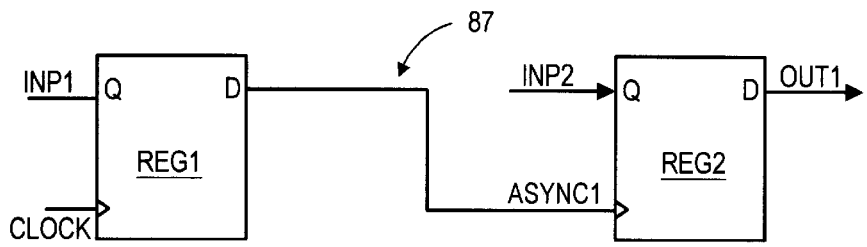
FIG. 3D illustrates, in a graph form, a circuit-under-verification having nodes in the arrangement of FIG. 3C.

Therefore, in step 71B (FIG. 3B), search preparation tool 71 automatically examines the graph for instances of an arrangement that can result in an asynchronous signal being used to clock a storage element, or to reset a storage element. For example, search preparation tool 71 automatically traverses the graph to find all instances of an arrangement 86 that includes two storage nodes 86A and 86C, wherein an output terminal D of a first storage node 86A is coupled to a clock terminal C of second node 86C, e.g. through a logic node 86B. In one example, search preparation tool 71 scans the following description of circuit 87 (FIG. 3D) in Verilog provided in file 1A (FIG. 3A):

```
module asynch_example (clk, Q_p, Q_pp, D_pp);
input clk;
input Q_p;
input Q_pp;
output D_pp;
reg reg1;
reg reg2;
assign D_pp = reg2;
always @ (posedge clk) begin
    reg1 <= Q_p;
end
always @ (posedge reg1) begin
    reg2 <= Q_pp;
end
endmodule;
```

Figure 3E:
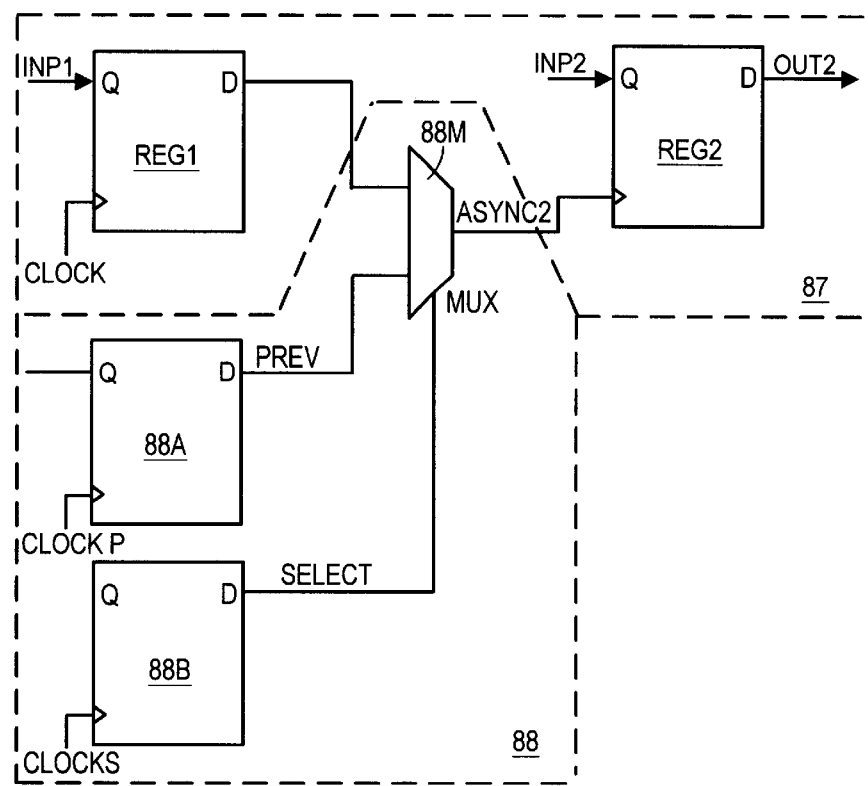
FIG. 3E illustrates, in a graph form, a circuit generated by performing the steps of FIG. 3B.
Figure 3F:
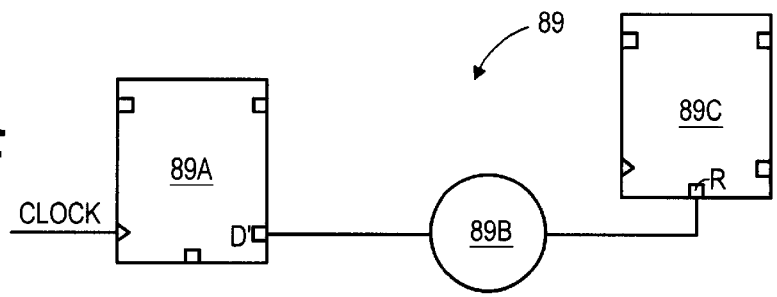
FIG. 3F illustrates, in a graph, an arrangement (of two storage nodes and a logic node and connections) that can cause asynchronous behavior in a circuit-under-verification by resetting a storage element with an asynchronous signal.
Figure 3H:
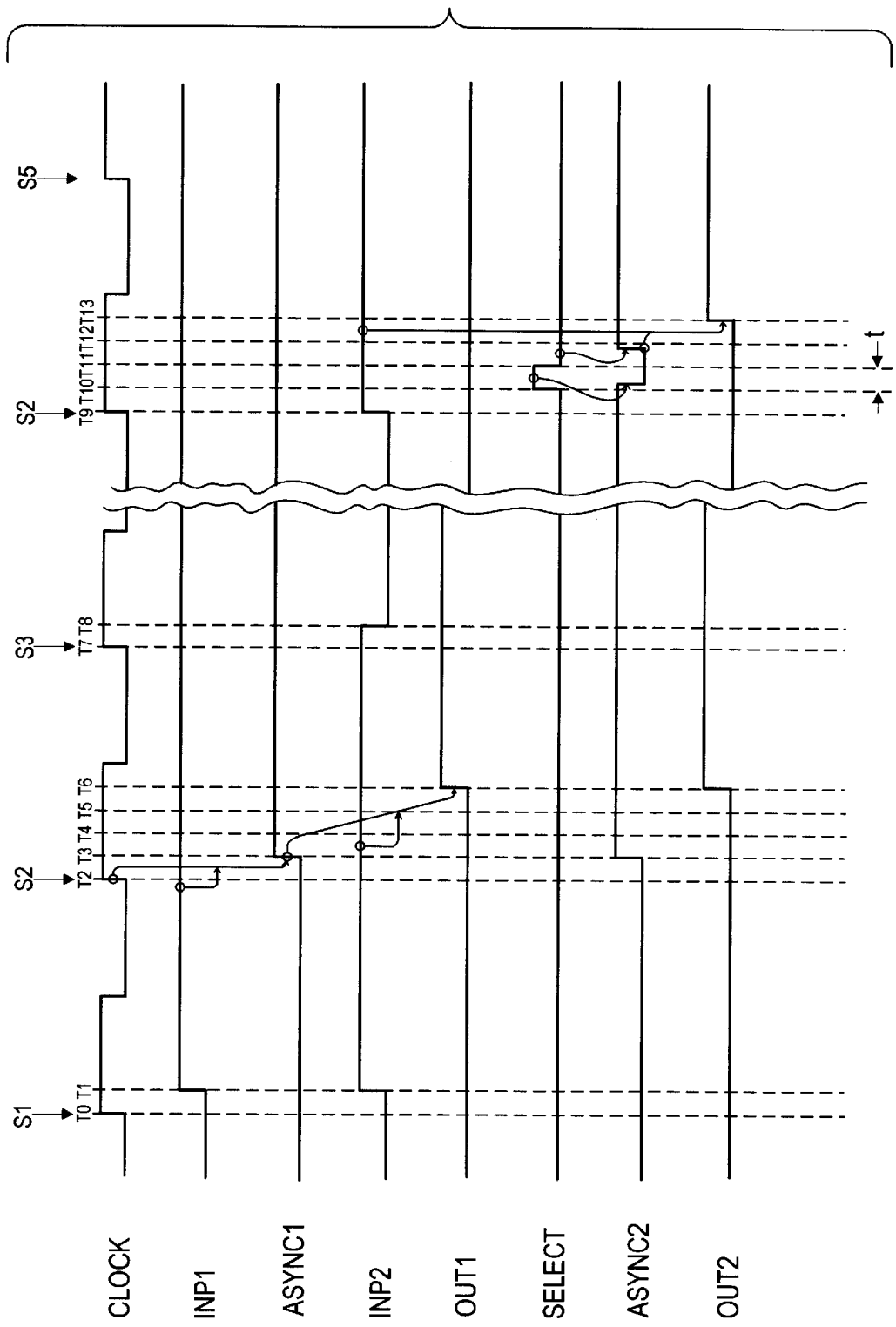
FIG. 3H illustrates, in a timing diagram, the temporal relationship between the substeps of FIG. 3G.

Circuit 87 (FIG. 3D) is in state S1 (FIG. 1C) at a rising edge in a clock signal CLOCK (e.g. at time T0 in FIG. 3H), and signal INP1 goes active at the Q terminal of storage element REG1 (FIG. 3D) a short time thereafter (e.g. at time T1). Therefore, storage element REG1 drives a signal ASYNC1 active a short time after the next rising edge (e.g. at time T2) in clock signal CLOCK (e.g. at time T3). The rising edge in signal ASYNC1 causes storage element REG2 to take the value of INP2 at time T6. Thereafter, when circuit 87 is restored to state S2 (e.g. at time T9), the signal ASYNC1 does not have a rising edge. Specifically, in the state prior to time T9, ASYNC1 is active and INP2 is inactive. At time T9, state S2 is restored to the simulator, for example using a C language interface to the simulator as illustrated by calls to the function "acc_set_value" in module sd, at lines 3264, 3607 and 3729 in microfiche Appendix 41. The step of restoring causes the values of all signals to take their respective values at time T6 when state S2 was first simulated. Consequently, INP2 becomes active and ASYNC1 remains active which causes REG2 to fail to clock a new value when simulated to state S5 in FIG. 1C because it does not observe a rising edge on ASYNC1.

Specifically, the rising edge in signal ASYNC1 causes storage element REG2 to supply during the transition from state S2 to state S3 (e.g. at time T6 in FIG. 3H) a signal INP2 received at the Q terminal as the output signal OUT1 at the D terminal However, in the absence of the rising edge in signal ASYNC1 after restoration, storage element REG2 fails to supply (e.g. during the transition from state S2 to state S5) signal INP2 as output signal OUT1. Therefore, in this example, signal OUT1 is low prior to the restoration step at time T9 and remains low at time T13 during simulation after restoration. The reference numerals T9–T16 (FIG. 3H) identify the simulation time after restoring state S2 and correspond to the reference numerals T2–T6 of simulation time after state S2 without restoration.

To recreate an asynchronous signal (e.g. signal ASYNC1), search preparation tool 71 generates a description of a restoration circuit that includes a multiplexer (e.g. multiplexer 88M) that has two input terminals, a control terminal and an output temrinal, wherein the output terminal is coupled to the second storage element (e.g. storage element REG2) and a first input terminal is coupled to the first storage element REG1. Each restoration circuit also includes (1) a first storage element (also called "previous value register", e.g. element 88A) coupled to the second input terminal of multiplexer and (2) a second storage element (also called "asynchronous MUX select register", e.g. element 88B) coupled to the control terminal of multiplexer.

In the above-described example, during step 71B (FIG. 3A), search preparation tool 71 finds that a storage element REG2 in circuit 87 has a clock terminal that is coupled to storage element REG1 in the above-described arrangement 86 (wherein there is no logic node in circuit 87), as illustrated in function "zi_hout_mark_gcm_asynch_reset" in module hout, at lines 9016 to 9094 in microfiche Appendix 28. On finding such an instance of arrangement 86 in circuit 87, search preparation tool 71 generates the following instructions in Verilog for a restoration circuit 88 (FIG. 3E) that assists in restoration of asynchronous signals in the circuit-under-verification (by directed search tool 72 in step 4; see FIG. 3A).

```
module asynch_example (clk, Q_p, Q_pp, D_pp);
input clk;
input Q_p;
input Q_pp;
output D_pp;
reg reg1;
reg reg2;
reg prev_reg1; // Extra registers and wire
reg asynch_mux_select;
wire asynch_clk;
assign asynch_clk =
    asynch_mux_select ? reg1 : prev_reg1;
    // Extra MUX
assign D_pp = reg2;
always @(posedge clk) begin
    reg1 <= Q_p;
end
always @(posedge asynch_clk) begin
// Clock from new wire from MUX
    reg2 <= Q_pp;
end
endmodule;
```

Thereafter, during the restoration of a state, e.g. state S2 (FIG. 1C), directed search tool 72 performs substeps 81–85 (FIG. 3G) in step 4 (FIG. 3A) using restoration circuits (e.g. circuit 88) generated by search preparation tool 71 to generate at least a majority of the asynchronous signals (all asynchronous signals in one example). Specifically, in substep 81; directed search tool 72 forces the values of a majority of the storage elements (in one example all the storage elements) in the circuit to the values that were held in the current state (e.g. in state S2). Next, in substep 82, directed search tool 72 forces each previous value register to hold the value at the first storage node in the arrangement (e.g. the value at storage node 86A) in the previous state. Specifically, in circuit 87 (FIG. 3E), directed search tool 72 causes previous value register 88A to hold the value in storage element REG1 in state S1, e.g. the value 0. Thereafter, in substep 83, directed search tool 72 forces each asynchronous MUX select register to the value that causes the multiplexer to pass to the clock terminal of the second storage element the signal from the previous value register. Therefore, in the above-described example, directed search tool 72 drives the signal CLOCKS active that in turn causes storage element 88B to drive signal SELECT active (as illustrated at time T10 in FIG. 3H).

Next, in step 34, directed search tool 72 forces the simulation to proceed for a non-zero time period, specifically the simulation time needed for the signal PREV from storage element 88 to go through multiplexer 88M and reach the clock terminal of storage element REG2. The time period can be, for example, one nanosecond of simulation time, even if the delay through multiplexer 88M is zero. Therefore, at time T11 the signal ASYNC2 at the clock terminal of storage element REG2 goes low as illustrated at time T11 in FIG. 3H. Thereafter, directed search tool 72 forces each asynchronous mux select register to the value that causes the multiplexer to pass the signal at the first storage node 86A (FIG. 3A) in state S2. In the above-described example, directed search tool 72 causes storage element 88B to drive the signal SELECT inactive that in turn causes multiplexer 88M to pass the signal of value 1 from storage element REG1 to the clock terminal of storage element REG2. Hence, signal ASYNC2 goes high at the clock terminal of storage element REG2 at time T12. Therefore, storage element REG2 receives, at the clock terminal, a rising edge in the signal at time T12 that in turn causes storage element REG2 to supply as signal OUT2 the signal INP2.

Figure 4:
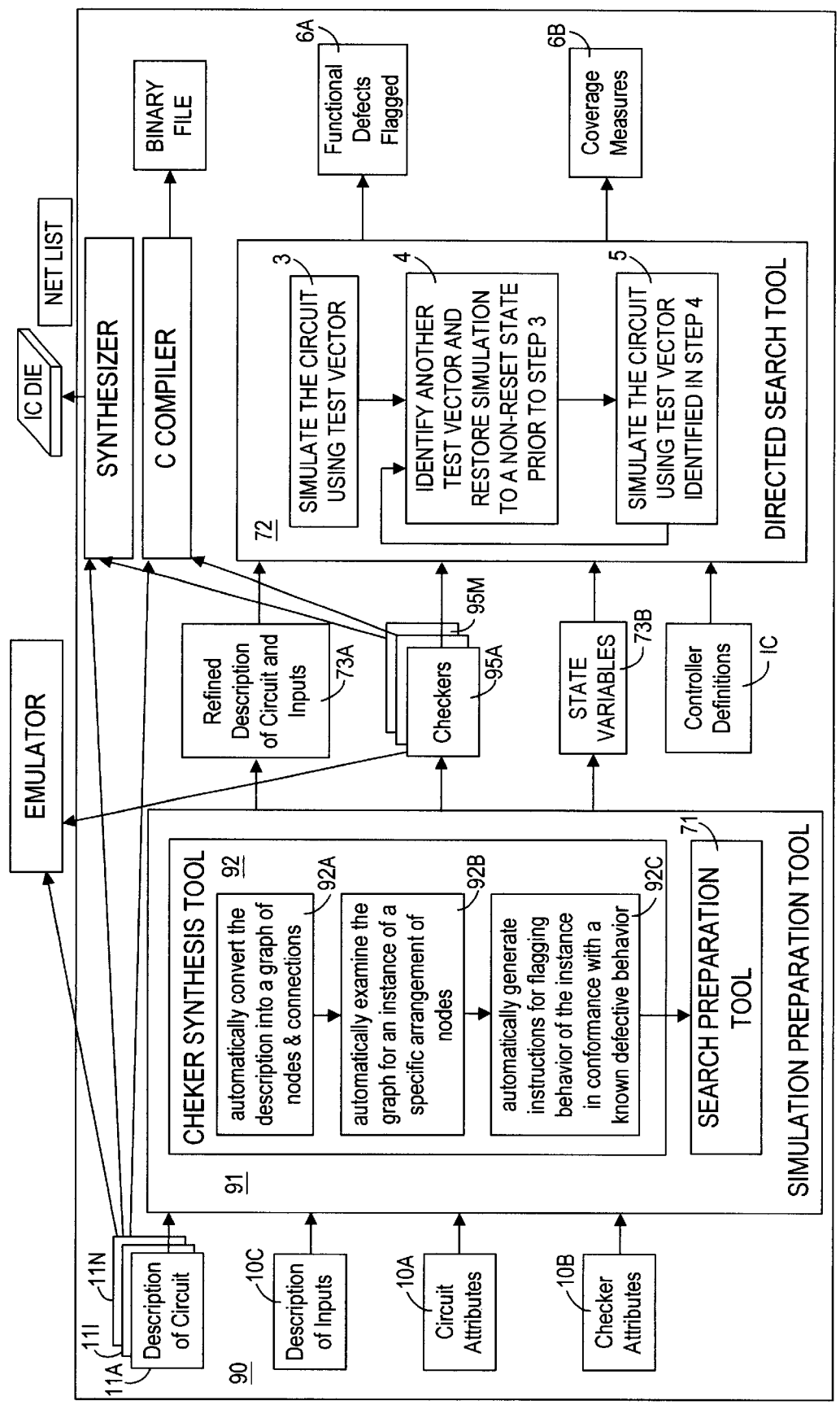
FIG. 4 illustrates, in a data flow diagram, use of a checker synthesis tool in a preparation tool for automatically generating checkers used during simulation by a directed search tool.

In another embodiment, the directed search tool 2 can be combined with automatically generated checkers as illustrated in FIG. 4. The automatically generated checkers are created by simulation preparation tool 91 from the circuit description by automatic conversion (see step 92A), automatic examination (see step 92B) and automatic generation (see step 92C), as described in the above-referenced U.S. patent application, Ser. No. 08/955,329.

Thereafter, the checkers (e.g. in files 95A–95M) are simulated with simulation of the circuit (as described in file 73A) by directed search tool 72. During the directed search, the checkers flag known defective behavior.

Appendices 1–58 in the microfiche attached hereto contain software listings and documentation as follows:

| Appendix Number | Appendix Name | Description |
| --- | --- | --- |
| 1 | arr | Data structures and utilities to implement arrays, used by many other modules, e.g. fsmdb |
| 2 | assertion | Handlers for assertions, used by many other modules, e.g. srch_ctrl |
| 3 | attr | Data structures and utilities for recording attributes in the database, used by dbo |
| 4 | avl | Data structures and utilities to implement a balanced tree, used by srch_ctrl |
| 5 | bdo | Calculates the binding distance offset of symbols, used by ss and sat |
| 6 | bm | Data structures and utilities to implement symbol bindings, used by sat |
| 7 | bv | Data structures and utilities to implement bit vectors, used by stmgr |
| 8 | chx | Creates checker models, called by dsh |
| 9 | cm | Creates and analyzes paths carrying data in the netlist, used by chx |
| 10 | conset | Data structures and utilities to implement constraints for symbols, used by sat |
| 11 | const | Data structures and utilities for Verilog constants, used by pt |
| 12 | cpli | Data structures and utilities for C-language interface to Verilog, called from simulator when running checkers |
| 13 | dbo | Maintains database of netlist, protocols and state machine attributes, used by dsh and sd |
| 14 | dcf | Data structures and utilities for search parameter file, used by sd |
| 15 | debug | Utilities to debug checker synthesis and search tools, used by many modules, e.g. srch_ctrl |
| 16 | dsesym | Data structures and utilities to implement a symbol table for search, used by stmgr and sd |
| 17 | dsh | Command shell for a user to interface to search preparation tool |
| 18 | elab | Converts the parse tree into netlist, called from dsh |
| 19 | er | Data structures and utilities to implement Verilog value change dump, used by seedex and sd |
| 20 | eval | Data structures and utilities for evaluating expressions, used by pm |
| 21 | expr | Data structures and utilities for creating expressions, used by pt and nl |
| 22 | fda | Data structures and utilities to implement optimized arrays, used by sat |
| 23 | fsmdb | Data structures and utilities to implement search pair arc coverage database, used by srch_ctrl |
| 24 | futil | Utilities to manipulate files, used by hout |
| 25 | gcm | Extract and write out Verilog model for search tool, called from dsh |
| 26 | gstack | Data structures and utilities to implement growable stack, used by sat |
| 27 | hash | Data structures and utilities to implement hash tables, used by many modules, e.g. fsmdb |
| 28 | hout | Writes out checker modules in verilog using support routines, called from dsh |
| 29 | hsh | Command shell for a user to interface to the checker synthesis tool |
| 30 | list | Data structures and utilities to implement linked lists, used by many modules, e.g. srch_ctrl |
| 31 | mem | Utilities to manage memory allocation, used by many modules, e.g. srch_ctrl |
| 32 | mesg | Utilities to print messages, used by many modules, e.g. srch_ctrl |
| 33 | nl | Analyzes the netlist, called from dsh |
| 34 | osd | Utilities to print messages, used by sd |
| 35 | osd_nonpli | Utilities to print messages, used by sd |
| 36 | pm | Data structures and utilities for protocol analysis and interpretation, used by srch_ctrl and seedex |
| 37 | pt | Data structures and utilities for building a parse tree, used by nl and pm |
| 38 | random | Utilities for generating pseudo-random numbers, used by srch_ctrl |
| 39 | sat | Data structures and utilities for search satisfiability analysis, used by satsetup |
| 40 | satsetup | Data structures and utilities to prepare for search satisfiability analysis, used by srch_ctrl |
| 41 | sd | Utilities to interface search tool to c-language interface of Verilog, called by the simulator to setup parameters, start the search tool and read & set the state of the circuit in simulation |
| 42 | seedex | Data structures and utilities for seed trace reading and interpretation used by srch_ctrl |
| 43 | slice | Data structures and utilities to implement bit-slices, used by chx |

-continued

| Appendix Number | Appendix Name | Description |
|---|---|---|
| 44 | snl | Data structures and utilities to implement netlist used for search, called from dsh and used by satsetup and sat |
| 45 | srch_ctrl | Data structures and utilities to control search, used by sd |
| 46 | ss | Data structures and utilities for symbolic simulation, used by srch_ctrl |
| 47 | stack | Data structures and utilities to implement stacks, used by srch_ctrl |
| 48 | stmgr | Data structures and utilities to manage states in search, used by srch_ctrl, fsmdb and sat |
| 49 | symb | Symbol table for Verilog parser, used by pt |
| 50 | ubv | Utilities to implement faster bit vector operations, used by stmgr and seedex |
| 51 | ufsm | Unroll FSM logic for analysis, called by dsh |
| 52 | value | Data structures and utilities to implement 16-value constants, used by ss and sat |
| 53 | version | Utilities to track the version of the checker synthesis and search tools, used by dsh |
| 54 | vout | Support routines for writing Verilog, used by hout |
| 55 | vp | Scans Verilog text and creates a parse tree, called from dsh |
| 56 | vpgen | Scans Verilog text and creates a parse tree for Verilog search model, called from dsh |
| 57 | vtype | Data structures and utilities for Verilog operations and types, used by vp |
| 58 | zdf | Utilities to save and restore netlist and attributes to disk, used by dbo |

Numerous modifications and adaptations of the embodiments described herein will be apparent to a person of skill in the art of electronic design automation (EDA) in view of the disclosure (including the software and documentation in microfiche Appendices 1–58 attached hereto, and the U.S. patent application, Ser. No. 08/955,329 incorporated by reference above). Other embodiments of a method in accordance with the invention include one or more of the following steps: automatically restoring a current state of simulation by applying a test vector that causes the simulation to return to the current state after one or more simulation cycles without entering a reset state; retaining in computer memory and using (for example, in step 41 of FIG. 2F) a subset of the states simulated; enumerating all possible next states of a current state (for example, in step 18 of FIG. 1B); using instructions in the "C" programming language to simulate the functional behavior of the circuit; using a "C" programming language description of a protocol controller; using a predetermined rule to select test vectors which uses as input the state of a protocol controller; using a predetermined rule which selects test vectors randomly; using a predetermined rule for selecting test vectors which selects all test vectors applicable to the current state; using more than one predetermined rule to select test vectors; using user-specified checkers in combination with directed search tool 2; using end-to-end tests in combination with directed search tool 2; using a golden model in combination with directed search tool 2; using instructions describing checkers as part of a verification quality-assurance test suite or regression test suite for a circuit description; using checkers in conjunction with a pre-existing testbench to find functional defects in a description of a circuit; using instructions describing checkers for characterizing the performance of a description of a circuit; and using instructions describing checkers to provide a measure of the functional testing of a description of a circuit. Therefore, many such variations of the embodiments described herein are encompassed by the attached claims.

What is claimed is:

1. A method of simulating, the method comprising:

simulating the functional behavior of a circuit in response to a first test vector, wherein the simulation has a current state, prior to said act of simulating;

automatically restoring the simulation after said simulating act to said current state, without causing the simulation to pass through a reset state, wherein said reset state being a state of the simulation in response to a simulated reset signal;

determining next states including a plurality of non-simulated states that can be reached from the current state; and simulating the functional behavior of said circuit in response to a second test vector, after said act of automatically restoring, to produce a circuit design description.

2. The method of claim 1 wherein said circuit includes at least a first controller capable of performing a plurality of first state transitions, and a second controller capable of performing a plurality of second state transitions, the method further comprising:

automatically determining, during each of said acts of simulating, for each pair of a first state transition and a second state transition performed simultaneously at least once, the number of times of said simultaneous performance, said number indicating a measure of the functional testing of said description.

3. The method of claim 1 further comprising: automatically applying a predetermined rule to identify said second test vector to transition from the current state to the next state, wherein the next state can be a simulated or non-simulated state.

4. The method of claim 1 further comprising:

automatically enumerating the said state transitions; and automatically applying a predetermined rule to identify said second test vectors, wherein said act of automatically applying uses as input to said predetermined rule at least one of said state transitions.

5. The method of claim 1, wherein said circuit includes at least a first controller capable of performing a plurality of first state transitions, and a second controller capable of performing a plurality of second state transitions, the method further comprising:

automatically determining, during each of said acts of simulating, for each pair of a first state transition and a second state transition performed simultaneously at least once, the number of times of said simultaneous performance; and automatically applying a predetermined rule to identify said second test vector; wherein said act of automatically applying uses as input to said predetermined rule at least one number determined by said act of automatically determining the number of times of said simultaneous performance.

6. The method of claim 1, wherein said current state is generated by simulating said circuit in response to a predetermined test vector.

7. The method of claim 1 wherein said circuit includes at least one asynchronous clock signal, said asynchronous clock signal having a first clock state when the simulation is in said current state, the method further comprising: setting the asynchronous clock signal to a second clock state, said second clock state being different from said first clock state; wherein said act of setting is performed prior to said act of automatically restoring, and after said act of simulating with said first test vector.

8. A method of simulating, the method comprising:

automatically converting a description of a circuit into a graph;

automatically examining said graph for an instance of a predetermined pattern, simulating the functional behavior of said circuit in response to a first test vector in a plurality of test vectors; wherein the simulation has a current state that is a non-reset state prior to said act of simulating;

automatically flagging, during said act of simulating, the functional behavior of said instance in violation of a rule associated with said predetermined pattern;

automatically restoring the simulation to said current state, said act of automatically restoring being performed after said simulating act without causing the simulation to pass through a reset state, wherein said reset state being a state of the simulation in response to a simulated reset signal; and simulating the functional behavior of said circuit in response to a second test vector, after said act of automatically restoring, to produce a circuit design description.

9. The method of claim 8 wherein said circuit includes a first controller capable of performing a plurality of first state transitions, and a second controller capable of performing a plurality of second state transitions, the method further comprising:

automatically determining, during each of said acts of simulating, for each pair of a first state transition and a second state transition performed simultaneously at least once, the number of times of said simultaneous performance, said number indicating a measure of the functional testing of said description.

10. A method for measuring the functional testing of a description of a circuit, said circuit including a first controller capable of performing a plurality of first state transitions, and a second controller capable of performing a plurality of second state transitions, the method comprising:

testing the functional behavior of said circuit with a first controller performing a first state transition simultaneous with a second controller performing a second state transition; and automatically determining, during said act of testing, the number of times of said simultaneous performance, said number indicating a measure of the functional testing of said description of the circuit.

11. A method for measuring the functional testing of a description of a circuit, said circuit including a first controller capable of performing a plurality of first state transitions, and a second controller capable of performing a plurality of second state transitions, the method comprising:

testing the functional behavior of said circuit;

automatically determining, during said act of testing, for each pair of a first state transition and a second state transition performed simultaneously at least once, the number of times of said simultaneous performance, said number indicating a measure of the functional testing of said description of the circuit; and generating descriptions of additional circuits that monitor portions of the circuit that are under testing, and during simulation each additional circuit is coupled to an instance of an arrangement of circuit elements associated with a known defective behavior, wherein the additional circuits monitor signals flowing to and from the instance and generate an error message on detecting the known defective behavior.

12. The method of claim 1, wherein the act of simulating after automatically restoring the functional behavior of said circuit in response to test vectors identified by automatically applying a predetermined rule is repeated until all test vectors have been used in the simulation.

13. The method of claim 1, further comprising:

automatically restoring the simulation to a state that is different from the current state; and transitioning the simulation from the state different from the current state to the current state by using a sequence of test vectors identified by automatically applying a predetermined rule.

14. The method of claim 1, wherein simulating a plurality of next states that are reachable from the current state by using different test vectors.

15. The method of claim 5, further comprising:

automatically selecting a plurality of states of the controller that have not been reached from the current state.

16. A method of searching for functional defects in a description of a circuit with at least a controller capable of transitioning between a plurality of states, the method comprising:

simulating the functional behavior of said circuit in response to a first test vector, wherein the simulation has a current state, prior to said act of simulating;

automatically restoring the simulation after said simulating act to said current state, without causing the simulation to pass through a reset state, wherein said reset state being a state of the simulation in response to a simulated reset signal;

determining next states including a plurality of non-simulated states that can be reached from the current state;

simulating the functional behavior of said circuit in response to a second test vector, after said act of automatically restoring; and generating descriptions of additional circuits that monitor portions of the circuit that are under verification, and during simulation each additional circuit is coupled to an instance of an arrangement of circuit elements associated with a known defective behavior.

17. The method of claim 16, wherein the additional circuits monitor signals flowing to and from the instance and generate an error message on detecting the known defective behavior.

18. A method of simulating a circuit description, the method comprising:

performing a first simulation for finding defects of said circuit description in response to a first test vector, wherein said circuit description has at least a controller capable of transitioning between a plurality of states and a current state prior to said first simulation;

automatically restoring said first simulation to said current state after said first simulation, without passing through a reset state, wherein said reset state is a simulated state determined by a simulated reset signal;

determining next states including a plurality of non-simulated states that are reachable from the current state; and performing a second simulation of said circuit description in response to a second test vector, after said act of automatically restoring said first simulation, thereby facilitating a faster method of simulation.

19. The method of claim 18, wherein said circuit description includes at least a first controller capable of performing a plurality of first state transitions and a second controller capable of performing a plurality of second state transitions, the method further comprising automatically enumerating for said first simulation and for said second simulation the number of times said first state transitions and said second state transitions occur simultaneously.

20. The method of claim 18 further comprising automatically applying a predetermined rule to identify said second test vector to transition from the current state to the next state, wherein the next state is a simulated or non-simulated state.

21. The method of claim 18 further comprising:

automatically enumerating said first state transition and said second state transition; and automatically applying a predetermined rule to identify said second test vector, wherein an input to said predetermined rule is at least one of said first and said second state transitions.

22. The method of claim 18, wherein said circuit description includes at least a first controller capable of performing a plurality of first state transitions and a second controller capable of performing a plurality of second state transitions, the method further comprising:

automatically enumerating for each of said simulating acts, the number of said first state transitions and said second state transitions occurring simultaneously; and automatically applying a predetermined rule to identify said second test vectors, wherein an input to said predetermined rule is at least one of said first and said second state transitions.

23. The method of claim 18, wherein said current state is generated by simulating said circuit description in response to a predetermined test vector.

24. The method of claim 18, wherein said circuit description includes at least one asynchronous clock signal, said asynchronous clock signal having a fist clock state when the simulation is in said current state, the method further comprising:

setting the asynchronous clock signal to a second clock state different from said first clock state; wherein said act of setting is performed prior to said act of automatically restoring, and after said act of simulating with said first test vector.

25. A method of simulating a circuit description, the method comprising:

automatically converting said circuit description into a graph for finding functional defects;

automatically examining said graph for an instance of a predetermined pattern;

simulating the functional behavior of said circuit description in response to a first test vector in a plurality of test vectors; wherein the simulation has a current state that is a non-reset state prior to said act of simulating;

automatically flagging, during said act of simulating, the functional behavior of said instance in violation of a rule associated with said predetermined pattern;

automatically restoring the simulation to said current state, said act of automatically restoring being performed after said simulating act without causing the simulation to pass through a reset state, wherein said reset state being a state of the simulation in response to a simulated reset signal; and simulating the functional behavior of said circuit in response to a second test vector, after said act of automatically restoring, to produce a circuit design description.

26. The method of claim 25, wherein said circuit description includes a first controller capable of performing a plurality of first state transitions, and a second controller capable of performing a plurality of second state transitions, the method further comprising automatically determining, during each of said acts of simulating, for each pair of a first state transition and a second state transition performed simultaneously at least once, the number of times of said simultaneous performance, said number indicating a measure of the functional testing of said description.

27. The method of claim 18, wherein said method is repeated until all test vectors have been used in the simulation.

28. The method of claim 18, further comprising:

automatically restoring said second simulation to a state that is different from the current state; and transitioning the simulation from the state different from the current state to the current state by using a sequence of test vectors identified by automatically applying a predetermined rule.

29. A method of simulating a circuit description, the method comprising:

performing inside a computer a first simulation of said circuit description in response to a first test vector;

automatically restoring said first simulation to said current state after said first simulation, without passing through a reset state, wherein said reset state is a simulated state determined by a simulated reset signal;

determining inside a computer next states including a plurality of non-simulated states that are reachable from the current state; and performing a second simulation of said circuit description in response to a second test vector, after said act of automatically restoring said first simulation, thereby facilitating a faster method of simulation.

30. The method of claim 29, wherein said circuit description includes at least one controller capable of transitioning between a plurality of states and a current state prior to said first simulation.

31. The method of claim 29, wherein said circuit description includes at least a first controller capable of performing a plurality of first state transitions and a second controller capable of performing a plurality of second state transitions, the method further comprising automatically enumerating for said first simulation and for said second simulation the number of times said first state transition and said second state transition occur simultaneously.

32. A method of simulating a circuit description, the method comprising:

performing inside a computer a first simulation of said circuit description in response to a first test vector;

automatically restoring said first simulation to a current state after said first simulation, without passing through a reset state, wherein said reset state is a simulated state determined by a simulated reset signal; and performing a second simulation from said current state, thereby facilitating a faster method of simulation.

33. The method of claim 32, further comprising the act of determining inside a computer next states including a plurality of non-simulated states that are reachable from the current state.

34. The method of claim 32, further comprising the act of performing a second simulation of said circuit description in response to a second test vector, after said act of automatically restoring said first simulation.

35. The method of claim 32, wherein said circuit description includes at least one controller capable of transitioning between a plurality of states and a current state prior to said first simulation.

36. The method of claim 32 wherein said circuit description includes at least a first controller capable of performing a plurality of first state transitions and a second controller capable of performing a plurality of second state transitions, the method further comprising automatically enumerating for said first simulation and for said second simulation the number of times said first state transition and said second state transition occur simultaneously.

37. The method of claim 32, being performed to produce a circuit design description.

* * * * *